US010529764B2

(12) United States Patent
Kobayashi et al.

(10) Patent No.: US 10,529,764 B2
(45) Date of Patent: Jan. 7, 2020

(54) SEMICONDUCTOR DEVICE, SOLID STATE IMAGING ELEMENT, AND ELECTRONIC APPARATUS

(71) Applicant: SONY CORPORATION, Tokyo (JP)

(72) Inventors: Shoji Kobayashi, Kanagawa (JP); Shin Iwabuchi, Kumamoto (JP); Toshikazu Shibayama, Kumamoto (JP); Mamoru Suzuki, Kanagawa (JP); Shunsuke Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/023,481

(22) PCT Filed: Oct. 24, 2014

(86) PCT No.: PCT/JP2014/078307
§ 371 (c)(1),
(2) Date: Mar. 21, 2016

(87) PCT Pub. No.: WO2015/068589
PCT Pub. Date: May 14, 2015

(65) Prior Publication Data
US 2016/0211296 A1    Jul. 21, 2016

(30) Foreign Application Priority Data

Nov. 6, 2013   (JP) .................................. 2013-230218
Mar. 19, 2014  (JP) .................................. 2014-056607

(51) Int. Cl.
*H01L 27/146*   (2006.01)
*H01L 31/09*    (2006.01)
(Continued)

(52) U.S. Cl.
CPC .... *H01L 27/14629* (2013.01); *H01L 27/1464* (2013.01); *H01L 27/14636* (2013.01);
(Continued)

(58) Field of Classification Search
None
See application file for complete search history.

(56) References Cited

U.S. PATENT DOCUMENTS

2005/0184291 A1*  8/2005  Cole ................... H01L 27/1463
                                                      257/59
2009/0200625 A1*  8/2009  Venezia .............. H01L 27/1463
                                                     257/432
(Continued)

FOREIGN PATENT DOCUMENTS

JP      2006-128392 A     5/2006
JP      2007-207828 A     8/2007
(Continued)

OTHER PUBLICATIONS

Machine language translation of JP 2010-245499 A.*
(Continued)

*Primary Examiner* — Erik Kielin
(74) *Attorney, Agent, or Firm* — Sheridan Ross P.C.

(57) ABSTRACT

The present disclosure relates to a semiconductor device, a solid state imaging element, and an electronic apparatus in which the adverse effect due to hot carrier luminescence can be suppressed. In them, an element formation unit in which a plurality of elements are formed and an interconnection unit in which interconnections connecting elements are formed are stacked. A structure object formed between a light receiving element that receives light and performs photoelectric conversion and an active element that forms a peripheral circuit placed around the light receiving element in such a manner that the gap in the thickness direction of the element formation unit is not more than a prescribed spacing and formed of a material that inhibits the propagation of light is placed in the element formation unit. The present (Continued)

technology can be applied to a back-side illumination solid state imaging element, for example.

15 Claims, 29 Drawing Sheets

(51) Int. Cl.
  *H04N 5/357* (2011.01)
  *H04N 5/374* (2011.01)
(52) U.S. Cl.
  CPC .............. *H01L 31/09* (2013.01); *H04N 5/357* (2013.01); *H04N 5/374* (2013.01)

(56) References Cited

U.S. PATENT DOCUMENTS

| | | | | |
|---|---|---|---|---|
| 2010/0133635 | A1* | 6/2010 | Lee | H01L 27/14623 257/433 |
| 2010/0238331 | A1* | 9/2010 | Umebayashi | H01L 27/14632 348/294 |
| 2010/0270636 | A1* | 10/2010 | Huang | H01L 27/14627 257/432 |
| 2011/0089517 | A1* | 4/2011 | Venezia | H01L 27/14603 257/447 |
| 2012/0261784 | A1* | 10/2012 | Roy | H01L 27/1463 257/447 |
| 2013/0323875 | A1* | 12/2013 | Park | H01L 31/02240 438/70 |
| 2014/0016012 | A1* | 1/2014 | Oishi | H04N 5/372 348/311 |
| 2014/0264719 | A1* | 9/2014 | Chou | H01L 21/76229 257/506 |

FOREIGN PATENT DOCUMENTS

| | | |
|---|---|---|
| JP | 2008-130795 A | 6/2008 |
| JP | 2010-245499 A | 10/2010 |
| JP | 2010-283271 A | 12/2010 |
| JP | 2012-164870 A | 8/2012 |
| JP | 2013-58661 A | 3/2013 |
| WO | WO 2013/115075 A1 | 8/2013 |

OTHER PUBLICATIONS

International Search Report prepared by the Japan Patent Office dated Jan. 16, 2015, for International Application No. PCT/JP2014/078307.
Official Action (with English translation) for Japanese Patent Application No. 2015-546601, dated Aug. 2, 2018, 36 pages.
Official Action (with English translation) for Chinese Patent Application No. 201480048183.2, dated Jun. 21, 2018, 21 pages.
Official Action (with English translation) for Japanese Patent Application No. 2015-546601, dated Apr. 2, 2019, 8 pages.

* cited by examiner

FIG. 20

|  | n | k |
|---|---|---|
| SiO$_2$ | 1.45 | 0 |
| Si | 3.6 | 0.001 |
| RESIN | 1.54 | 0 |
| SiN | 1.84 | 0 |
| W | 3.05 | 3.39 |
| Air | 1 | 0 |

FIG. 21

| | LIGHT SOURCE-PIXEL DISTANCE | Si THICKNESS | DEPTH | NUMBER | PITCH | MATERIAL |
|---|---|---|---|---|---|---|
| STANDARD | 100 μm | 17 μm | 3 μm | 30 | 1 μm | SiN |
| CONDITION 1 | | | 6 μm | 30 | 1 μm | SiN |
| | | | 10 μm | 30 | 1 μm | SiN |
| CONDITION 2 | | | 3 μm | 45 | 1 μm | SiN |
| | | | 3 μm | 60 | 1 μm | SiN |
| CONDITION 3 | | | 3 μm | 30 | 1.5 μm | SiN |
| | | | 3 μm | 30 | 2 μm | SiN |
| CONDITION 4 | | | 3 μm | 30 | 1 μm | Air |
| | | | 3 μm | 30 | 1 μm | SiO$_2$ |
| | | | 3 μm | 30 | 1 μm | W |

SEMICONDUCTOR DEVICE, SOLID STATE IMAGING ELEMENT, AND ELECTRONIC APPARATUS

CROSS REFERENCE TO RELATED APPLICATIONS

This application is a national stage application under 35 U.S.C. 371 and claims the benefit of PCT Application No. PCT/JP2014/078307 having an international filing date of 24 Oct. 2014, which designated the United States, which PCT application claimed the benefit of Japanese Patent Application No. 2013-230218 filed 6 Nov. 2013, and Japanese Patent Application No. 2014-056607 filed 19 Mar. 2014, the disclosures of which are incorporated herein by reference in their entirety.

TECHNICAL FIELD

The present disclosure relates to a semiconductor device, a solid state imaging element, and an electronic apparatus, and relates particularly to a semiconductor device, a solid state imaging element, and an electronic apparatus in which the adverse effect due to hot carrier luminescence can be suppressed.

BACKGROUND ART

These days, electronic cameras are increasingly widely used, and demand for solid state imaging elements (image sensors), which are central parts of them, is growing more and more. Technical development to achieve higher image quality and higher functionality is continued in the performance aspect of the solid state imaging element. On the other hand, with the spread to mobile phones, PDAs, notebook personal computers, etc., not to mention video cameras and mobile cameras, it is becoming essential for the solid state imaging element and its parts to be reduced in size, weight, and thickness in order to facilitate portability and to be reduced in cost in order to expand the spread.

In general, in a solid state imaging device, a photoelectric conversion element, an amplifier circuit, a peripheral circuit for image processing, and a multiple-layer interconnection layer for connecting elements and circuits are formed on the side of a first major surface (light receiving surface) of a silicon substrate. The solid state imaging device has a structure in which a cover glass is placed above the first major surface of a chip on which a light condensing structure of a microlens, a color filter, etc. is formed and a terminal is formed on the outer peripheral side of the first major surface or on the side of a second major surface of the chip.

To achieve higher functionality and higher speed of the solid state imaging device, the scale of the peripheral circuit is increased and also the processing speed of the peripheral circuit is increased. When it is attempted to improve the gradation expression (resolution) as a measure of increasing the image quality, it is necessary to increase the voltage. On the other hand, to achieve lower cost, it is desired to place the pixel unit and the peripheral circuit near to each other to make the chip size as small as possible.

However, in this case, since the photoelectric conversion element and the peripheral circuit are formed close to each other, issues peculiar to the image sensor occur. Since the photoelectric conversion element handles minute carriers (electrons) as a signal, it is likely that the effects of heat and electromagnetic fields from the surrounding circuit will be mixed in as noise. In addition, also minute hot carrier luminescence emitted from a transistor and a diode has a great effect on the image sensor characteristics.

The hot carrier luminescence is a luminescence that occurs due to the generation and recombination of electrons and holes generated when carriers accelerated between source and drain undergo impact ionization at the drain end, or due to the state transition of either of electrons and holes. The luminescence steadily occurs even in a transistor without any problems in characteristics, although at a low level. The amount of luminescence increases exponentially as the voltage applied to the transistor becomes higher.

The amount of luminescence is increased also when the transistor is put in high-speed operation. Since the luminescence diffuses in all directions, the effect becomes much smaller as the distance from the transistor becomes larger; but when the photoelectric conversion element and the circuit are placed very near to each other, the luminescence does not diffuse so much and a considerable number of photons are injected into the photoelectric conversion element. Since the diffusion is not sufficient, a distribution of the occurrence of hot carrier luminescence that occurs due to the differences in the density of transistors placed and the proportion of active transistors in the circuit will appear undesirably in the image as two-dimensional information. Hence, a structure designed for light blocking which is in order to suppress the amount of injection into the photoelectric conversion element to the detection limit or less is needed.

A similar effect may be given also to, not limited to the photoelectric conversion element, high-sensitivity analog elements. For example, in devices such as flash memories, since movements toward higher density and multiple-valued operations have been advanced, there is a concern that the value retained will change when noise mixing from the outside occurs.

To address such problems, in Patent Literatures 1 and 2, a light blocking structure designed to suppress the propagation of light is provided between a photoelectric conversion element and a peripheral circuit.

For example, in the technology disclosed in Patent Literature 1, as shown in FIG. 7 of Patent Literature 1, a light blocking structure having a height approximately equal to or more than the height of a photoelectric conversion element or a structure that refracts light is formed in a semiconductor substrate, and thereby the propagation of light caused by hot carrier luminescence generated from a peripheral circuit is suppressed. Furthermore, as shown in FIG. 16 of Patent Literature 1, a structure in which an anti-reflection film designed to prevent the reflection of near-infrared light is formed in order to prevent light generated in a transistor from arriving at and being reflected at the back surface side is provided.

Similarly, in the technology disclosed in Patent Literature 2, as shown in FIG. 7 of Patent Literature 2, a light blocking member is formed on the travel path of light generated in a peripheral circuit, and thereby the incidence of light on a photoelectric conversion element is suppressed.

In the technology disclosed in Patent Literature 1, as shown in FIG. 7 and FIG. 18 of Patent Literature 1, the light blocking structure is formed with a depth approximately equal to or more than the depth of the photoelectric conversion element or with such a depth as to suppress the propagation of holes generated in the peripheral circuit unit. In the case of such a structure, although components propagating in a straight line from the peripheral circuit toward the photoelectric conversion element can be blocked, light has wave components and therefore propagates by going round below the light blocking structure. That is, the light blocking structure having a depth approximately equal to the depth of the photoelectric conversion element does not provide sufficient light blocking effect, and light propagates by passing through the space below the light blocking structure. Even if the propagation of holes is successfully blocked, there is little suppression effect by the hole propagation blocking because most of the holes have recombined and changed into light components in the close vicinity of the peripheral circuit.

Patent Literature 1 provides also the anti-reflection film of near-infrared light for suppressing reflection when light caused by hot carrier luminescence has propagated up to the back surface side of the substrate. On the other hand, light generated in the transistor is radiated in all directions, and is therefore incident on the anti-reflection film with various angles. When the angle is a certain angle or less, light is totally reflected at the interface. Therefore, even when the anti-reflection film is present, it is very difficult to completely suppress the propagation of light.

In the case of a structure in which the semiconductor substrate is made thin up to approximately several micrometers, the distance from the transistor to the back surface side is significantly shortened, and light is not attenuated much and propagates up to the back surface side. Consequently, not only near-infrared light but also blue light arrives at the back surface side, and the anti-reflection film of near-infrared light cannot suppress light. In particular, in the case of a back-side illumination solid state imaging device, which has recently been developed, since the substrate needs to be made thin in order to take in light from the back surface side of the substrate, the amount of components propagating by being reflected at the back surface side is significantly increased, and the amount of light noise components is significantly increased.

Also in Patent Literature 2, a light blocking structure is provided between the peripheral circuit and the photoelectric conversion element, like in Patent Literature 1; but it is only mentioned that the light blocking structure is provided on the path of light emitted from the transistor; hence, it is very difficult to suppress components of light propagating by going round. That is, in the technology disclosed in Patent Literature 2, light propagates by passing through the space below the light blocking structure, like in Patent Literature 1.

Although the technology disclosed in Patent Literature 2 has a feature in that there is a light blocking film above the photoelectric conversion unit, this is a structure peculiar to front-side illumination solid state imaging devices and hence is not applied to back-side illumination solid state imaging devices. As described above, the amount of light noise components is significantly increased in the back-side illumination solid state imaging device; therefore, it is very difficult for the technology disclosed in Patent Literature 2 to completely suppress the propagation of light.

CITATION LIST

Patent Literature

Patent Literature 1: JP 2010-245499A
Patent Literature 2: JP 2002-043566A

SUMMARY OF INVENTION

Technical Problem

As described above, in the technologies disclosed in Patent Literatures 1 and 2, light caused by hot carrier luminescence in the peripheral circuit cannot be prevented from propagating through the semiconductor substrate and being incident on the photoelectric conversion element, and it has been difficult to suppress the adverse effect due to hot carrier luminescence. In particular, in the back-side illumination solid state imaging device, the adverse effect is great because the amount of light noise components is significantly increased due to the configuration in which the semiconductor substrate is made thin. Furthermore, as described above, light generated by hot carrier luminescence may give a similar adverse effect to, as well as the photoelectric conversion element, high-sensitivity analog elements.

The present disclosure is carried out in view of such circumstances, and makes it possible to suppress the adverse effect due to hot carrier luminescence.

Solution to Problem

According to an aspect of the present disclosure, there is provided a semiconductor device including: an element formation unit in which a plurality of elements are formed; and an interconnection unit that is stacked on the element formation unit and in which interconnections connecting the elements are formed. A passive element configured to be affected by light, an active element that forms a peripheral circuit placed around the passive element, and a structure object formed between the passive element and the active element in such a manner that a gap in a thickness direction of the element formation unit is not more than a prescribed spacing and formed of a material that inhibits propagation of light are placed in the element formation unit.

According to an aspect of the present disclosure, there is provided a solid state imaging element including: an element formation unit in which a plurality of elements are formed; and an interconnection unit that is stacked on the element formation unit and in which interconnections connecting the elements are formed. A light receiving element configured to receive light and perform photoelectric conversion, an active element that forms a peripheral circuit placed around the light receiving element, and a structure object formed between the light receiving element and the active element in such a manner that a gap in a thickness direction of the element formation unit is not more than a prescribed spacing and formed of a material that inhibits propagation of light are placed in the element formation unit. Light that the light receiving element receives is applied to a back surface that is on an opposite side to a front surface at which the interconnection unit is stacked on the element formation unit. A support substrate configured to support a substrate in which the element formation unit and the interconnection unit are stacked is joined to a front surface side of the substrate.

According to an aspect of the present disclosure, there is provided an electronic apparatus including a solid state imaging element, the solid state imaging element including an element formation unit in which a plurality of elements are formed, and an interconnection unit that is stacked on the element formation unit and in which interconnections connecting the elements are formed. A light receiving element configured to receive light and perform photoelectric conversion, an active element that forms a peripheral circuit placed around the light receiving element, and a structure object formed between the light receiving element and the active element in such a manner that a gap in a thickness direction of the element formation unit is not more than a prescribed spacing and formed of a material that inhibits propagation of light are placed in the element formation unit. Light that the light receiving element receives is applied to a back surface that is on an opposite side to a front surface at which the interconnection unit is stacked on the element formation unit. A support substrate configured to support a substrate in which the element formation unit and the interconnection unit are stacked is joined to a front surface side of the substrate.

In an aspect of the present disclosure, an element formation unit in which a plurality of elements are formed and an interconnection unit that is stacked on the element formation unit and in which interconnections connecting elements are formed are provided, and a passive element or a light receiving element, an active element that forms a peripheral circuit placed around the passive element or the light receiving element, and a structure object formed between the passive element or the light receiving element and the active element in such a manner that the gap in the thickness direction of the element formation unit is not more than a prescribed spacing and formed of a material that inhibits the propagation of light are placed in the element formation unit.

Advantageous Effects of Invention

According to an aspect of the present disclosure, it is possible to suppress the adverse effect due to hot carrier luminescence.

BRIEF DESCRIPTION OF DRAWINGS

FIG. 20 is a diagram showing the refractive index n and the attenuation coefficient k of each material.

FIG. 21 is a diagram showing simulation conditions.

DESCRIPTION OF EMBODIMENTS

Hereinbelow, specific embodiments to which the present technology is applied are described in detail with reference to the drawings.

Figure 1:
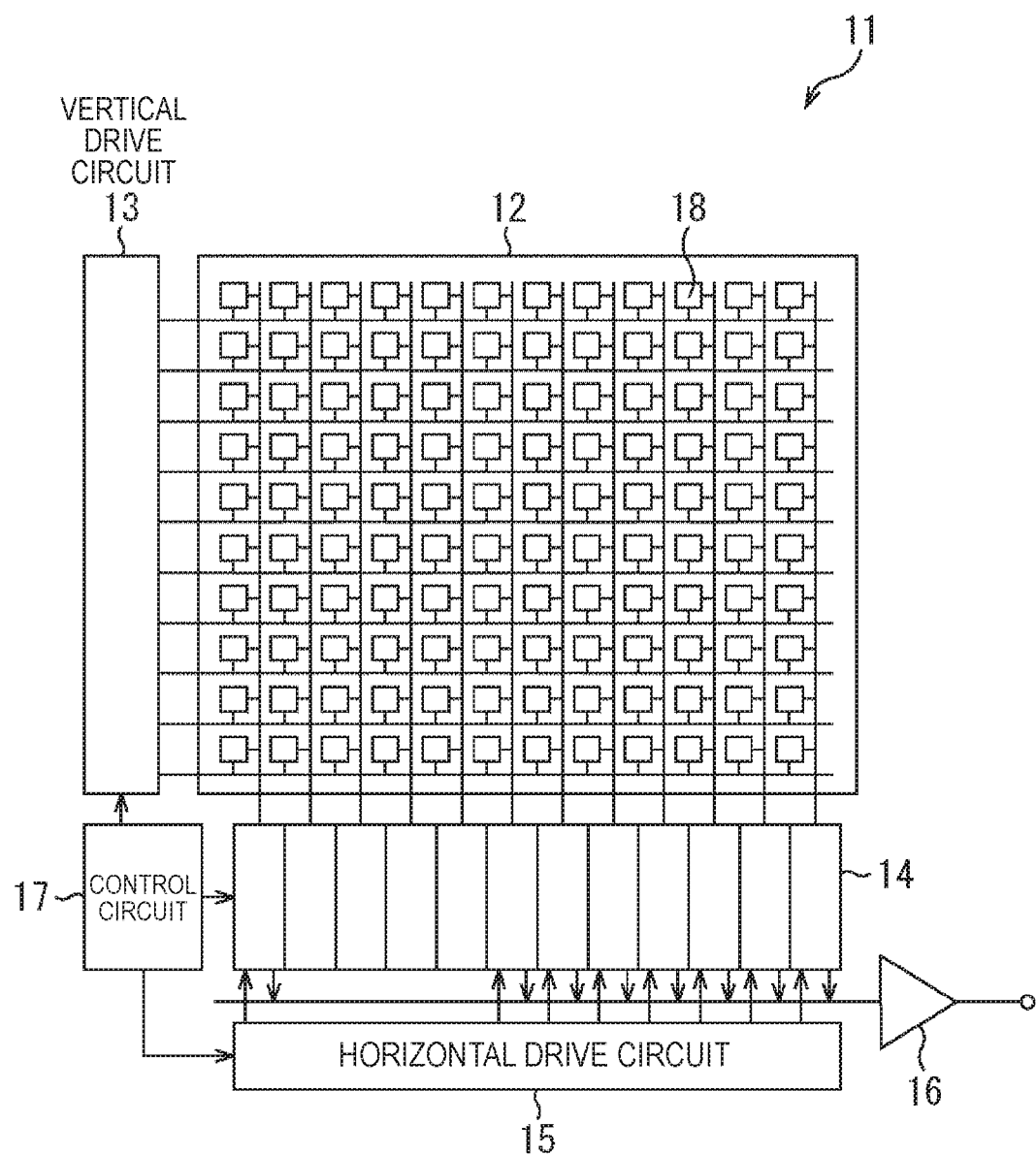
FIG. 1 is a block diagram showing a configuration example of a first embodiment of a solid state imaging element to which the present technology is applied.

FIG. 1 is a block diagram showing a configuration example of a first embodiment of a solid state imaging element to which the present technology is applied.

In FIG. 1, a solid state imaging element 11 is configured to include a pixel region 12, a vertical drive circuit 13, a column signal processing circuit 14, a horizontal drive circuit 15, an output circuit 16, and a control circuit 17.

A plurality of pixels 18 are arranged in a matrix configuration in the pixel region 12, and each pixel 18 is connected to the vertical drive circuit 13 via a horizontal signal line and is connected to the column signal processing circuit 14 via a vertical signal line. The plurality of pixels 18 each output a pixel signal in accordance with the quantity of light applied via a not-shown optical system, and an image of a subject formed on the pixel region 12 is created from the pixel signals.

The vertical drive circuit 13 supplies to the pixel 18 a driving signal for driving (transferring, selecting, resetting, etc.) each pixel 18 via the horizontal signal line, sequentially in units of each row of the plurality of pixels 18 arranged in the pixel region 12. The column signal processing circuit 14 performs correlated double sampling (CDS) processing on the pixel signals outputted from a plurality of pixels 18 via the vertical signal line, and thereby performs the analog/digital conversion of the pixel signal and removes the reset noise.

The horizontal drive circuit 15 supplies to the column signal processing circuit 14 a driving signal for causing the pixel signal to be outputted from the column signal processing circuit 14, sequentially in units of each row of the plurality of pixels 18 arranged in the pixel region 12. The output circuit 16 amplifies the pixel signal supplied from the column signal processing circuit 14 at a timing in accordance with the driving signal of the horizontal drive circuit 15, and outputs the resulting signal to an image processing circuit in a later stage.

The control circuit 17 controls the driving of each block in the solid state imaging element 11. For example, the control circuit 17 generates a clock signal in accordance with the driving period of each block, and supplies the clock signal to each block.

Next, a cross-sectional configuration example of the solid state imaging element 11 is described with reference to FIG. 2.

Figure 2:
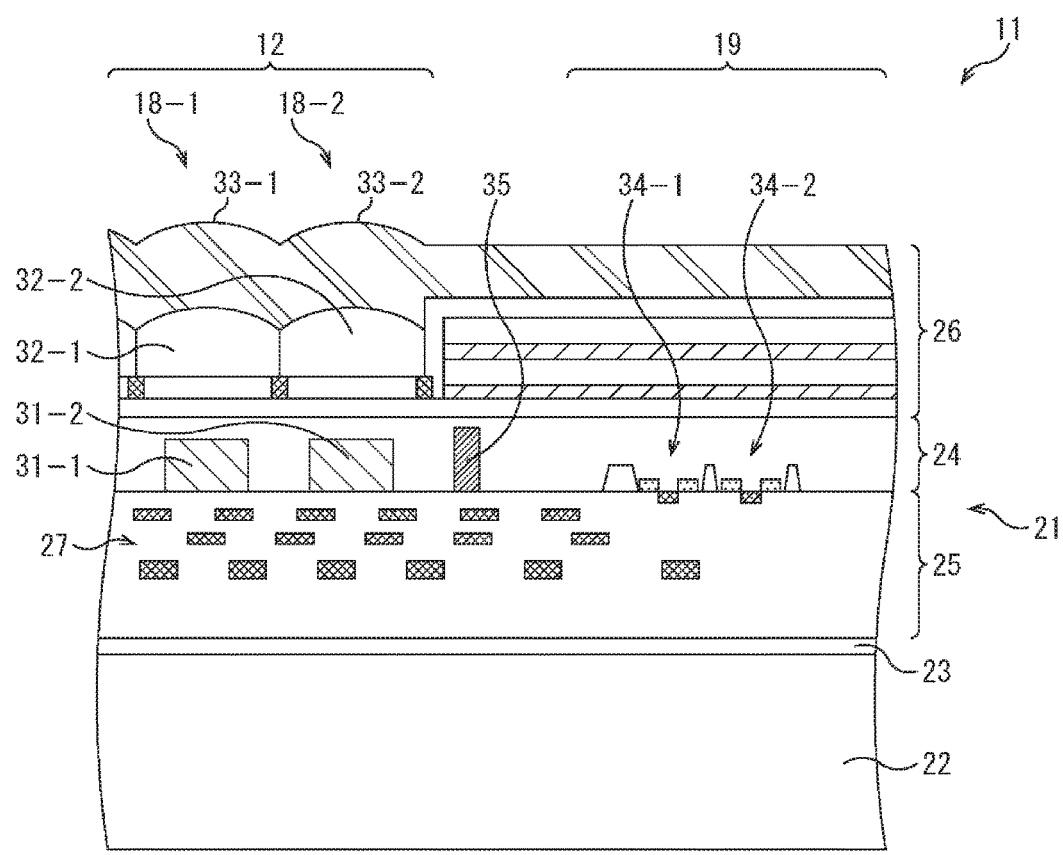
FIG. 2 is a diagram showing a cross-sectional configuration example of the solid state imaging element.

In FIG. 2, a cross-sectional configuration example in a boundary portion between the pixel region 12 and a peripheral circuit 19, which constitute the solid state imaging element 11, is shown. The peripheral circuit 19 is a general term for those placed around the pixel region 12 out of the vertical drive circuit 13, the column signal processing circuit 14, the horizontal drive circuit 15, the output circuit 16, or the control circuit 17.

As shown in FIG. 2, the solid state imaging element 11 is formed by a first substrate 21 that is a substrate in which elements constituting the pixel region 12 and the peripheral circuit 19 are placed and a second substrate 22 that is a substrate that supports the first substrate 21 being joined via a joining layer 23.

In the first substrate 21, an element formation unit 24, an interconnection unit 25, and a light condensing unit 26 are stacked. The element formation unit 24 is, for example, a thinly sliced silicon wafer of a single crystal of high-purity silicon; and the interconnection unit 25 is stacked on one surface (the surface facing down in FIG. 2) of the element formation unit 24, and the light condensing unit 26 is stacked on the surface facing the opposite side to the one surface (the surface facing up in FIG. 2). Hereinafter, the surface at which the interconnection unit 25 is stacked on the element formation unit 24 is referred to as a front surface, and the surface at which the light condensing unit 26 is stacked on the element formation unit 24 is referred to as a back surface, as appropriate. That is, the solid state imaging element 11 is a back-side illumination solid state imaging element in which light is applied from the back surface side of the first substrate 21.

In the interconnection unit 25, a plurality of interconnections 27 connecting elements formed in the element formation unit 24 are placed via an interlayer insulating film. Via the interconnections 27, a driving signal for controlling the driving of the peripheral circuit 19 is supplied, and the pixel signal read from the plurality of pixels 18 arranged in the pixel region 12 is outputted, for example.

For each of the plurality of pixels 18 arranged in the pixel region 12 of the solid state imaging element 11, a light receiving element 31 is formed in the element formation unit 24, and a color filter 32 and an on-chip lens 33 are formed in the light condensing unit 26.

Two pixels 18-1 and 18-2 are shown in the example of FIG. 2. That is, the pixel 18-1 is configured to include a light receiving element 31-1, a color filter 32-1, and an on-chip lens 33-1, and the pixel 18-2 is configured to include a light receiving element 31-2, a color filter 32-2, and an on-chip lens 33-2. When the pixels 18-1 and 18-2 are similarly configured and there is no need to distinguish them, hereinafter they are referred to as the pixel 18 and also the parts constituting the pixels 18-1 and 18-2 are referred to similarly, as appropriate.

The light receiving element 31 receives the light applied through the color filter 32 and the on-chip lens 33 and performs photoelectric conversion, and generates a charge in accordance with the quantity of the light. The color filter 32 transmits light of a prescribed color (e.g. red, green, and blue) for each pixel 18, and the on-chip lens 33 condenses the light applied to the light receiving element 31 for each pixel 18.

The peripheral circuit 19 of the solid state imaging element 11 is composed of a plurality of active elements 34, and two active elements 34-1 and 34-2 are shown in the example of FIG. 2. The active elements 34-1 and 34-2 are a semiconductor element such as a transistor, for example, and the configuration thereof will be described with reference to FIG. 3. When there is no need to distinguish the active elements 34-1 and 34-2, hereinafter they are referred to as the active element 34 as appropriate.

Thus, in the element formation unit 24 in the solid state imaging element 11, the light receiving element 31 is placed in the pixel region 12, and the active element 34 is placed in the peripheral circuit 19. In the element formation unit 24 in the solid state imaging element 11, a structure object 35 formed of a material that inhibits the propagation of light is placed between the pixel region 12 and the peripheral circuit 19.

Here, the structure object 35 is described with reference to FIG. 3. A rough configuration example in which the structure object 35 of the solid state imaging element 11 and the vicinity are enlarged is shown in A of FIG. 3 and B of FIG. 3.

Figure 3:
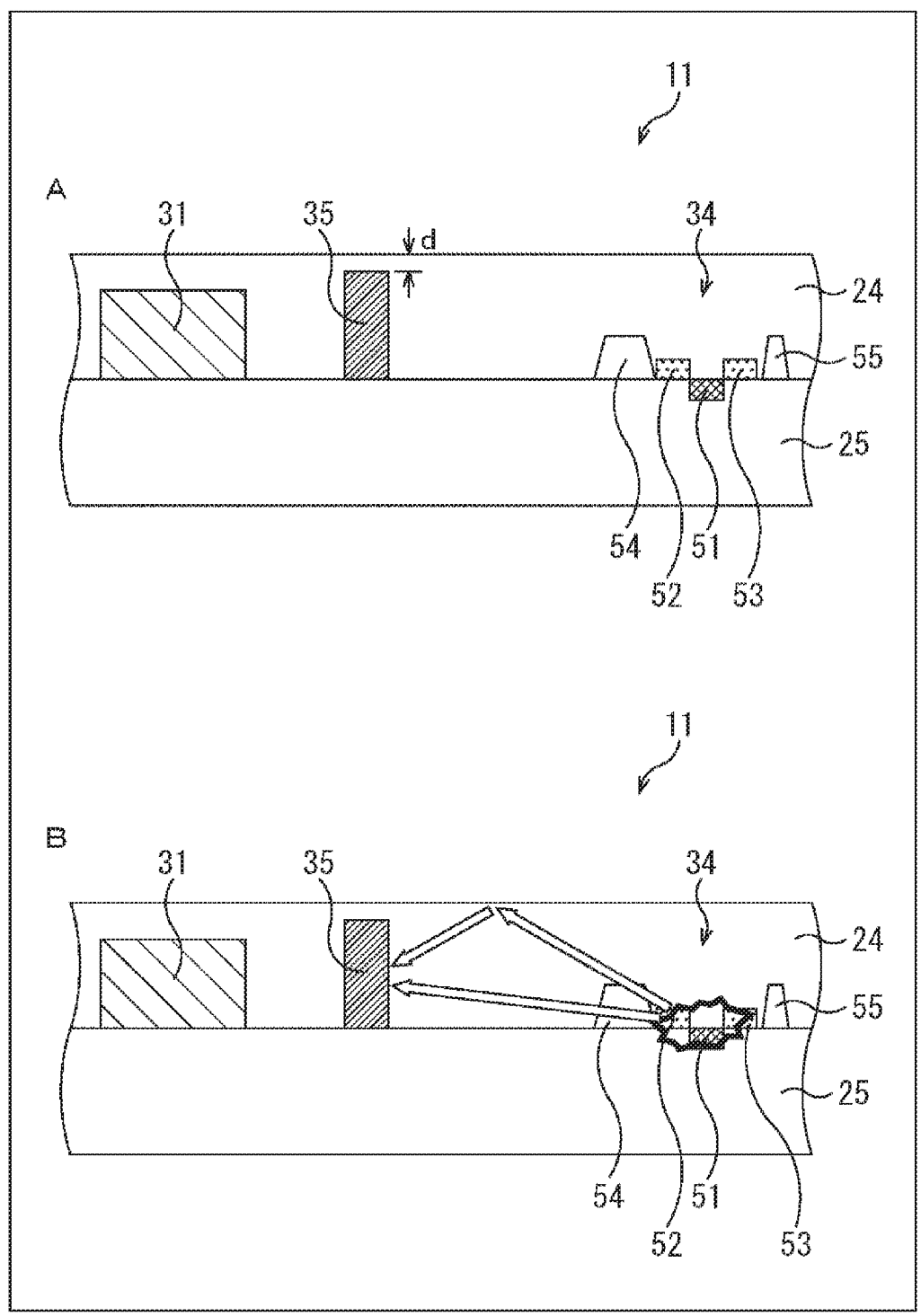
FIG. 3 is a diagram showing a rough configuration example in which a structure object and the vicinity are enlarged.

As shown in FIG. 3, the active element 34 is composed of a gate electrode 51, a drain region 52, a source region 53, and element isolation units 54 and 55. The gate electrode 51 is formed on the front surface of the element formation unit 24 via a not-shown insulating film, and the drain region 52 and the source region 53 are formed in places across the gate electrode 51 on the front surface side of the element formation unit 24. The element isolation units 54 and 55 are formed so as to isolate the active element 34 from other adjacent active elements 34.

In the time of the driving of the active element 34 thus configured, as described above, light generated by hot carrier luminescence may be incident on the light receiving element 31, and has thus far had an adverse effect on the signal outputted from the light receiving element 31.

Hence, in the solid state imaging element 11, in order to inhibit the propagation of light through the element formation unit 24, the structure object 35 formed of a material that refracts or absorbs light is placed between the pixel region 12 and the peripheral circuit 19, that is, between the light receiving element 31 and the active element 34.

As the material that forms the structure object 35 and refracts light, for example, a material with a permittivity different from that of the semiconductor substrate (Si), such as silicon oxide ($SiO_2$), silicon nitride (SiN), or a high-permittivity material ($HfO_2$ or $ZrO_2$), may be used. As the material that forms the structure object 35 and absorbs light, a single film of a semiconductor having a narrower band gap than silicon, such as germanium (Ge) or a compound-based material (e.g. chalcopyrite; $CuInSe_2$), may be used.

Thus, as shown in B of FIG. 3, the light that is generated by hot carrier luminescence in the active element 34 and travels toward the light receiving element 31 directly from the active element 34 or by being reflected at the front surface or back surface of the element formation unit 24 is, when transmitted through the structure object 35, scattered due to the difference in refractive index or absorbed. Thereby, the quantity of light generated by hot carrier luminescence and transmitted through the structure object 35 can be reduced, and the incidence of the light on the light receiving element 31 can be avoided.

The structure object 35 is formed by digging the front surface (the surface facing down in FIG. 3) of the element formation unit 24, and has a configuration in which the spacing d of the gap between the tip of the structure object 35 and the back surface of the element formation unit 24 is a short wavelength (e.g. approximately 400 nm) or less. By thus forming the gap between the tip of the structure object 35 and the back surface of the element formation unit 24 so that the gap in the thickness direction of the element formation unit 24 has the spacing d, light generated by hot carriers can be prevented from passing through the gap. Thereby, the incidence of light generated by hot carriers on the light receiving element 31 can be avoided, and the adverse effect of the light on the signal outputted from the light receiving element 31 can be suppressed.

Thus, in the solid state imaging element 11, the structure object 35 formed of a material that refracts or absorbs light is placed between the pixel region 12 and the peripheral circuit 19, thereby, the adverse effect due to light generated by hot carriers can be suppressed.

Thereby, in the solid state imaging element 11, even when the quantity of light of luminescence caused by hot carriers in the peripheral circuit 19 is large, there is no need to consider effects that may lead to noise sources of the light receiving element 31; thus, the peripheral circuit 19 can be operated at high speed and high voltage. Furthermore, since the peripheral circuit 19 that operates at high speed and high voltage can be placed near the pixel region 12, the chip size of the solid state imaging element 11 can be reduced and cost reduction can be achieved.

Figure 4:
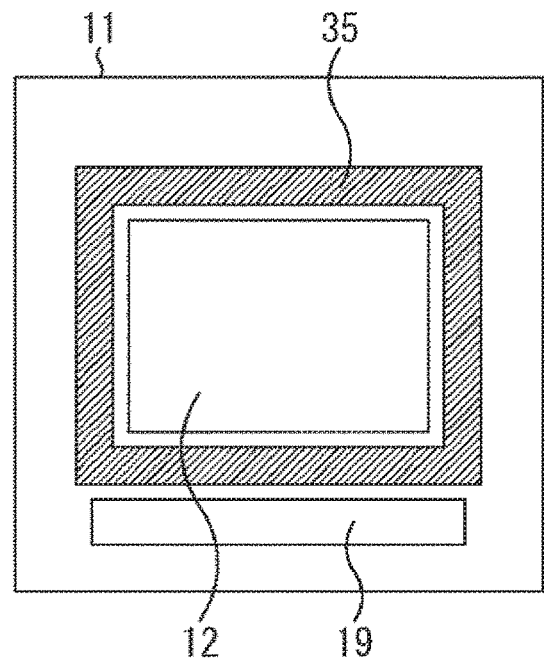
FIG. 4 is a diagram showing a first planar placement example of the structure object.

In FIG. 4, a first planar placement example of the structure object 35 is shown.

As shown in FIG. 4, in the solid state imaging element 11, the structure object 35 is placed so as to pass between the pixel region 12 and the peripheral circuit 19 and surround the pixel region 12 in a planar view. By thus placing the structure object 35, light generated in the active element 34 of the peripheral circuit 19 can be prevented from entering the pixel region 12 from any direction. Thus, the adverse effect due to light generated by hot carriers can be suppressed more reliably.

Figure 5:
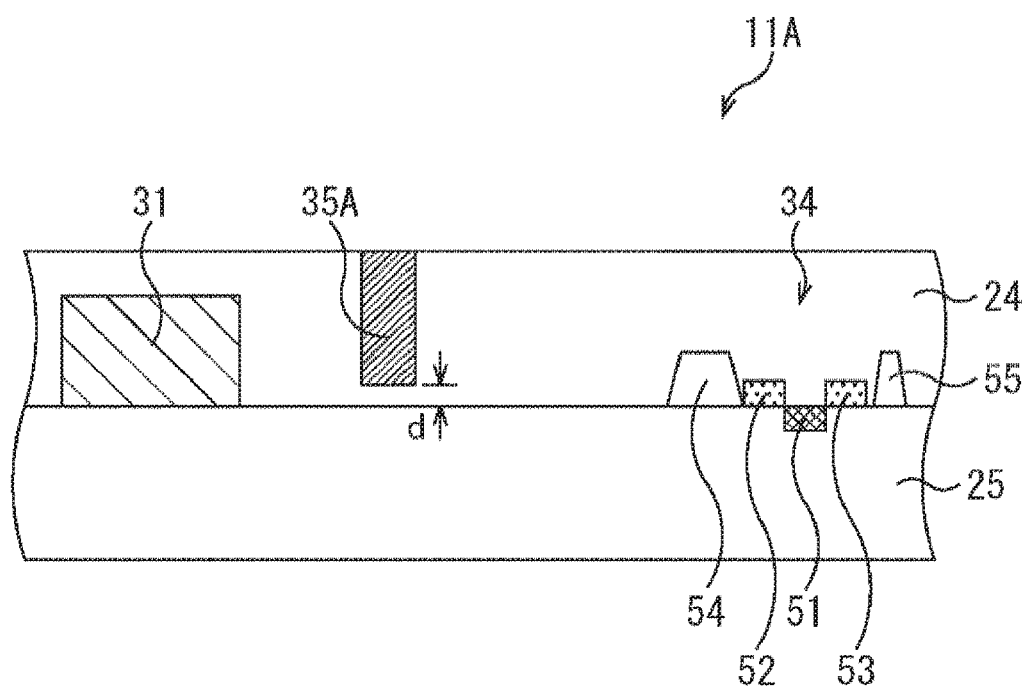
FIG. 5 is a diagram showing a first modification example in the first embodiment of the solid state imaging element.

Next, a first modification example in the first embodiment of the solid state imaging element 11 is shown in FIG. 5.

As shown in FIG. 5, in a solid state imaging element 11A, a structure object 35A formed between the active element 34 and the light receiving element 31 has a configuration different from that in the solid state imaging element 11 of FIG. 3. Otherwise, the configuration of the solid state imaging element 11A is similar to the configuration of the solid state imaging element 11 of FIG. 3, and a detailed description thereof is omitted.

That is, while in the solid state imaging element 11 of FIG. 3 the structure object 35 is formed by digging the front surface side of the element formation unit 24, in the solid state imaging element 11A the structure object 35A is formed by digging the back surface side of the element formation unit 24. The structure object 35A is formed of a material that refracts or absorbs light, and has a configuration in which the spacing d of the gap between the tip of the structure object 35A and the front surface of the element formation unit 24 is a short wavelength (e.g. approximately 400 nm) or less, similarly to the structure object 35.

Therefore, also in the solid state imaging element 11A, light generated by hot carrier luminescence is scattered at or absorbed in the structure object 35A and can be prevented from passing through the gap on the tip side, like in the solid state imaging element 11 of FIG. 3. Thereby, the solid state imaging element 11A can avoid the incidence of light generated by hot carriers on the light receiving element 31, and can suppress the adverse effect due to the light.

Figure 6:
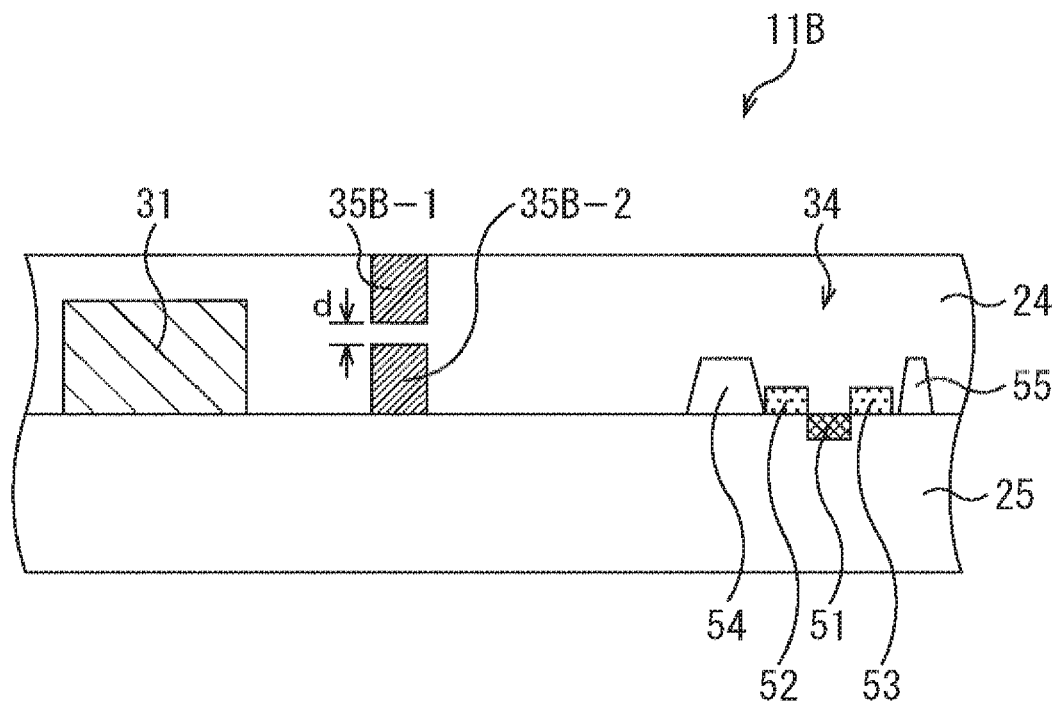
FIG. 6 is a diagram showing a second modification example in the first embodiment of the solid state imaging element.

Next, a second modification example in the first embodiment of the solid state imaging element 11 is shown in FIG. 6.

As shown in FIG. 6, in a solid state imaging element 11B, structure objects 35B-1 and 35B-2 formed between the active element 34 and the light receiving element 31 have a configuration different from that in the solid state imaging element 11 of FIG. 3. Otherwise, the configuration of the solid state imaging element 11B is similar to the configuration of the solid state imaging element 11 of FIG. 3, and a detailed description thereof is omitted.

That is, while in the solid state imaging element 11 of FIG. 3 the structure object 35 is formed by digging the front surface side of the element formation unit 24, in the solid state imaging element 11B the structure objects 35B-1 and 35B-2 are formed by digging the front surface side and the back surface side of the element formation unit 24. The structure objects 35B-1 and 35B-2 are formed of a material that refracts or absorbs light, similarly to the structure object 35.

The solid state imaging element 11B has a configuration in which, for example, the spacing d of the gap between the tip of the structure object 35B-1 formed from the back surface side to near the center of the element formation unit 24 and the tip of the structure object 35B-2 formed from the front surface side to near the center of the element formation unit 24 is a short wavelength (e.g. approximately 400 nm) or less. The spacing between the front surface of the element formation unit 24 and the tip of the structure object 35B-1 and the spacing between the back surface of the element formation unit 24 and the tip of the structure object 35B-2 do not need to be suppressed to approximately a short wavelength. It is effective to employ the configuration of the solid state imaging element 11B when, for example, it is difficult to control the gap to the front surface or the back surface for reasons of process processing variations etc.

Thus, in the solid state imaging element 11B, the incidence of light generated by hot carrier luminescence on the light receiving element 31 can be avoided by the configuration in which the structure object 35B-1 and the structure object 35B-2 are combined.

Therefore, also in the solid state imaging element 11B, light generated by hot carrier luminescence is scattered at or absorbed in the structure objects 35B-1 and 35B-2, like in the solid state imaging element 11 of FIG. 3. Thereby, the solid state imaging element 11B can avoid the incidence of light generated by hot carriers on the light receiving element 31, and can suppress the adverse effect due to the light.

Figure 7:
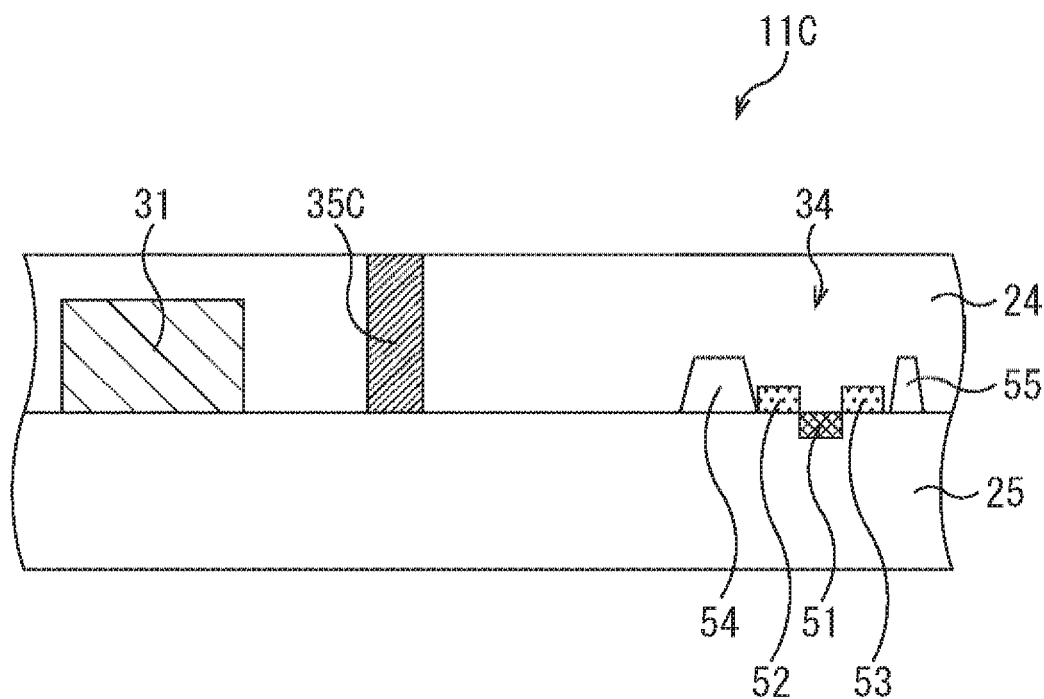
FIG. 7 is a diagram showing a third modification example in the first embodiment of the solid state imaging element.

Next, a third modification example in the first embodiment of the solid state imaging element 11 is shown in FIG. 7.

As shown in FIG. 7, in a solid state imaging element 11C, a structure object 35C formed between the active element 34 and the light receiving element 31 has a configuration different from that in the solid state imaging element 11 of FIG. 3. Otherwise, the configuration of the solid state imaging element 11C is similar to the configuration of the solid state imaging element 11 of FIG. 3, and a detailed description thereof is omitted.

That is, while in the solid state imaging element 11 of FIG. 3 the structure object 35 is formed by digging the front surface side of the element formation unit 24, in the solid state imaging element 11C the structure object 35C is formed so as to penetrate from the front surface side to the back surface side of the element formation unit 24. That is, in the solid state imaging element 11C, the structure object 35C is formed without a gap being formed in the thickness direction of the element formation unit 24. The structure object 35C is formed of a material that refracts or absorbs light, similarly to the structure object 35.

Therefore, also in the solid state imaging element 11C, light generated by hot carrier luminescence is scattered at or absorbed in the structure object 35C, like in the solid state imaging element 11 of FIG. 3. Thereby, the solid state imaging element 11C can avoid the incidence of light generated by hot carriers on the light receiving element 31, and can suppress the adverse effect due to the light. Furthermore, in the solid state imaging element 11C, control such as providing the spacing d at the time of digging the element formation unit 24 during the formation of the structure object 35, like in the solid state imaging element 11 of FIG. 3, is not needed; thus, the structure object 35C can be formed easily.

Figure 8:
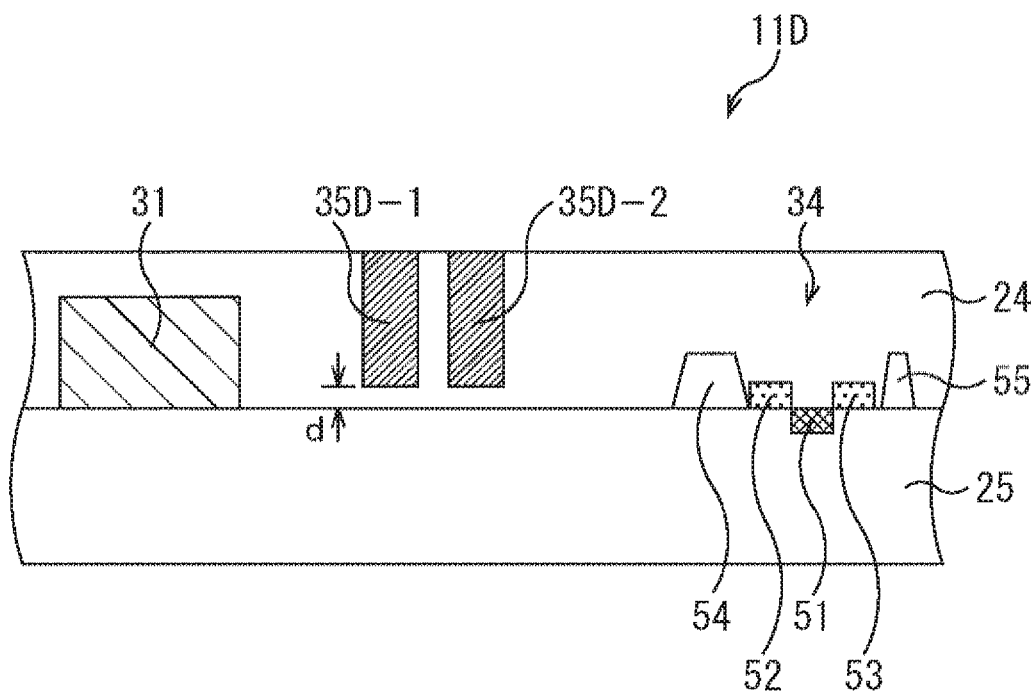
FIG. 8 is a diagram showing a fourth modification example in the first embodiment of the solid state imaging element.

Next, a fourth modification example in the first embodiment of the solid state imaging element 11 is shown in FIG. 8.

As shown in FIG. 8, in a solid state imaging element 11D, structure objects 35D-1 and 35D-2 formed between the active element 34 and the light receiving element 31 have a configuration different from that in the solid state imaging element 11 of FIG. 3. Otherwise, the configuration of the solid state imaging element 11D is similar to the configuration of the solid state imaging element 11 of FIG. 3, and a detailed description thereof is omitted.

That is, while in the solid state imaging element 11 of FIG. 3 one structure object 35 is formed in the element formation unit 24, in the solid state imaging element 11D two structure objects 35D-1 and 35D-2 are formed in the element formation unit 24. The structure objects 35D-1 and 35D-2 are formed of a material that refracts or absorbs light, and have a configuration in which the spacing d of the gap between the tip of the structure objects 35D-1 and 35D-2 and the front surface of the element formation unit 24 is a short wavelength (e.g. approximately 400 nm) or less, similarly to the structure object 35. Although a configuration example in which the two structure objects 35D-1 and 35D-2 are placed between the active element 34 and the light receiving element 31 is shown in FIG. 8, also a configuration in which two or more structure objects 35D are placed in the space from the active element 34 to the light receiving element 31 is possible.

Therefore, also in the solid state imaging element 11D, light generated by hot carrier luminescence is scattered at or absorbed in the structure objects 35D-1 and 35D-2 and can be prevented from passing through the gap on the tip side, like in the solid state imaging element 11 of FIG. 3. In particular, in the solid state imaging element 11D, by placing a plurality of structure objects 35D, light is scattered or absorbed every time it is transmitted through the structure object 35D; thereby, the effect of suppressing the transmitted light can be improved more than in the configuration in which one structure object 35 is placed. Thereby, the solid state imaging element 11D can avoid the incidence of light generated by hot carriers on the light receiving element 31, and can suppress the adverse effect due to the light.

Figure 9:
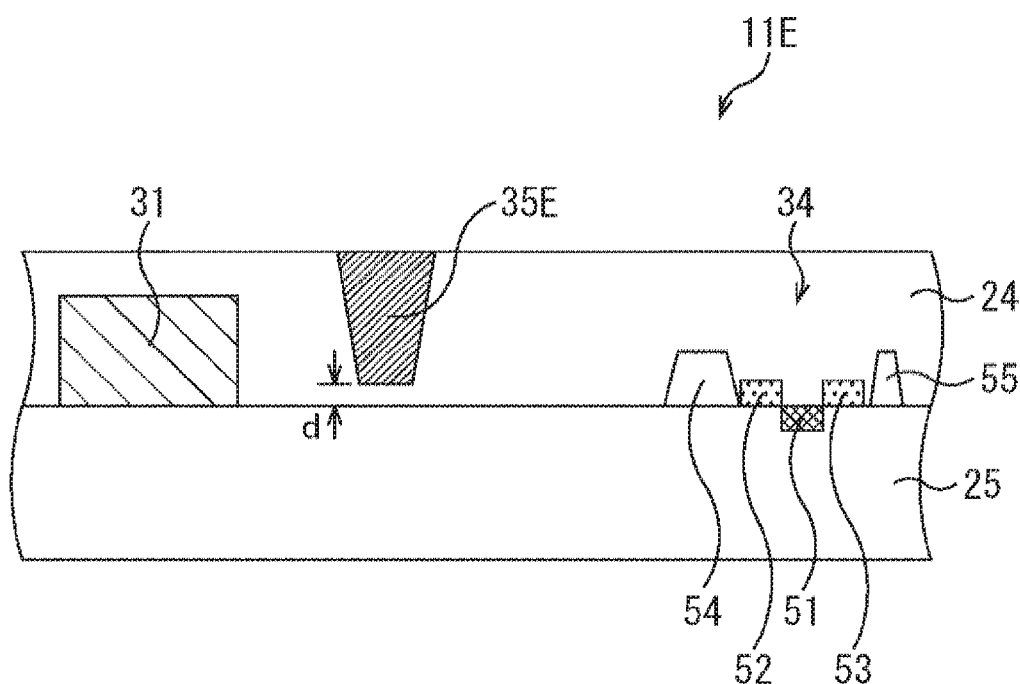
FIG. 9 is a diagram showing a fifth modification example in the first embodiment of the solid state imaging element.

Next, a fifth modification example in the first embodiment of the solid state imaging element 11 is shown in FIG. 9.

As shown in FIG. 9, in a solid state imaging element 11E, a structure object 35E formed between the active element 34 and the light receiving element 31 has a configuration different from that in the solid state imaging element 11 of FIG. 3. Otherwise, the configuration of the solid state imaging element 11E is similar to the configuration of the solid state imaging element 11 of FIG. 3, and a detailed description thereof is omitted.

That is, while in the solid state imaging element 11 of FIG. 3 the structure object 35 is formed to have a side wall parallel to the thickness direction (a direction substantially orthogonal to the front surface and the back surface) of the element formation unit 24, in the solid state imaging element 11E the structure object 35E is formed such that a side wall toward the thickness direction of the element formation unit 24 is inclined with respect to the thickness direction. For example, as shown in FIG. 9, in the solid state imaging element 11E, the structure object 35E is formed so as to have a side wall inclined such that the width becomes narrower with transition from the back surface toward the front surface of the element formation unit 24. The structure object 35E is formed of a material that refracts or absorbs light, and has a configuration in which the spacing d of the gap between the tip of the structure object 35E and the front surface of the element formation unit 24 is a short wavelength (e.g. approximately 400 nm) or less, similarly to the structure object 35.

Therefore, also in the solid state imaging element 11E, light generated by hot carrier luminescence is scattered at or absorbed in the structure object 35E and can be prevented from passing through the gap on the tip side, like in the solid state imaging element 11 of FIG. 3. In particular, in the solid state imaging element 11E, the refraction effect at the structure object 35E can be improved by forming the structure object 35 such that a side wall is inclined. For example, when light propagating toward the light receiving element 31 in the element formation unit 24 is incident on the structure object 35E, the light can be greatly bent with respect to its travel direction. Thus, by the improvement in the light scattering effect by the structure object 35E, the solid state imaging element 11E can avoid the incidence of light generated by hot carriers on the light receiving element 31, and can suppress the adverse effect due to the light.

Figure 10:
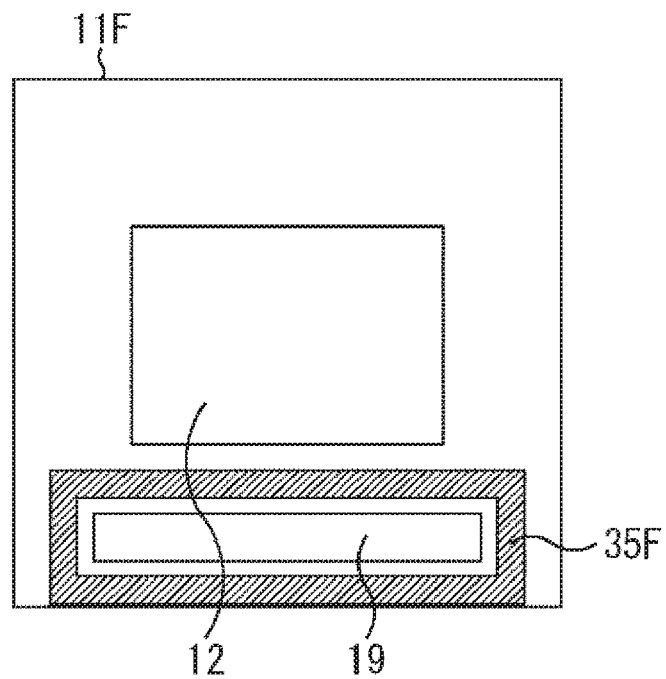
FIG. 10 is a diagram showing a second planar placement example of the structure object.

Next, a second planar placement example of the structure object 35 is shown in FIG. 10.

As shown in FIG. 10, in a solid state imaging element 11F, a structure object 35F is placed so as to pass between the pixel region 12 and the peripheral circuit 19 and surround the peripheral circuit 19 in a planar view. By thus placing the structure object 35F, light generated in the active element 34 of the peripheral circuit 19 can be prevented from leaking in any direction, and the light can be prevented from entering the pixel region 12. Therefore, in the solid state imaging element 11F, the adverse effect due to light generated by hot carriers can be suppressed reliably. As the cross-sectional configuration of the structure object 35F, any of the structures of the structure object 35 shown in FIG. 3 and FIGS. 5 to 9 may be employed.

Figure 11:
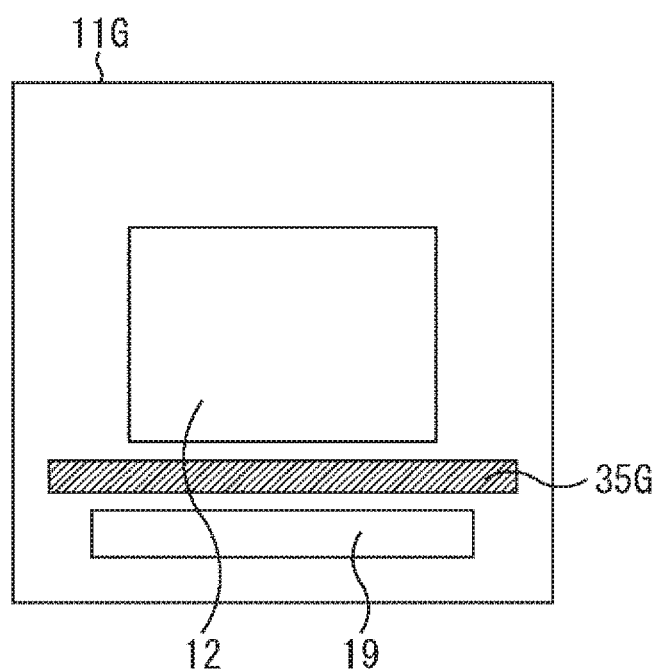
FIG. 11 is a diagram showing a third planar placement example of the structure object.

Next, a third planar placement example of the structure object 35 is shown in FIG. 11.

As shown in FIG. 11, in a solid state imaging element 11G, a structure object 35G is placed so as to pass at least between the pixel region 12 and the peripheral circuit 19 and block at least light travelling in a straight line from the peripheral circuit 19 to the pixel region 12. By thus placing the structure object 35G, light generated in the active element 34 of the peripheral circuit 19 can be prevented from entering the pixel region 12 in a straight line. Therefore, in the solid state imaging element 11G, the adverse effect due to light generated by hot carriers can be suppressed. As the cross-sectional configuration of the structure object 35G, any of the structures of the structure object 35 shown in FIG. 3 and FIGS. 5 to 9 may be employed.

Figure 12:
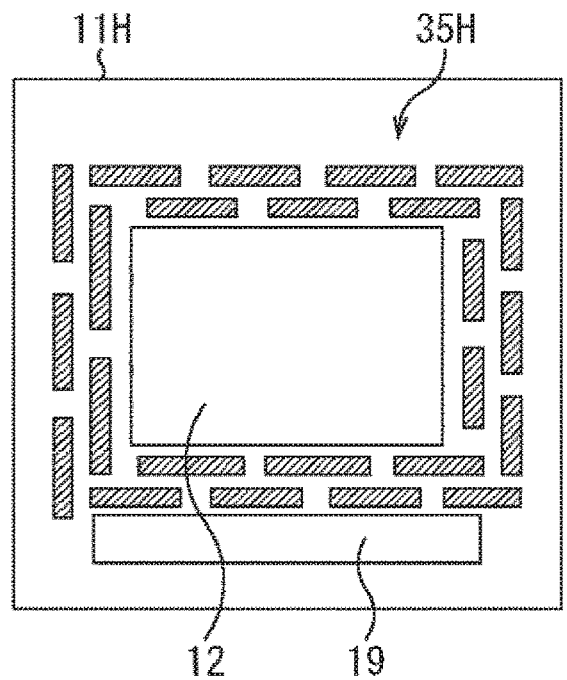
FIG. 12 is a diagram showing a fourth planar placement example of the structure object.

Next, a fourth planar placement example of the structure object 35 is shown in FIG. 12.

As shown in FIG. 12, in a solid state imaging element 11H, a structure object 35H formed by a combination of a plurality of structure objects is placed so as to pass between the pixel region 12 and the peripheral circuit 19 and surround the pixel region 12 in a planar view. Here, in the structure object 35H, the structure objects are arranged so that any of the structure objects is surely placed on the straight line running from the outside of the structure object 35H toward the pixel region 12, that is, so that light does not slip through in a straight line from the outside of the structure object 35H toward the pixel region 12.

By the structure object 35H of such a configuration, in the solid state imaging element 11H, light generated in the active element 34 of the peripheral circuit 19 can be prevented from entering the pixel region 12 in a straight line. Therefore, the adverse effect due to light generated by hot carriers can be suppressed. The solid state imaging element 11H is effective particularly in a configuration in which stress concentration occurs locally during the formation of the structure object 35 and a relatively large-sized shape cannot be formed, for example. As the cross-sectional configuration of the structure object 35H, any of the structures of the structure object 35 shown in FIG. 3 and FIGS. 5 to 9 may be employed.

Figure 13:
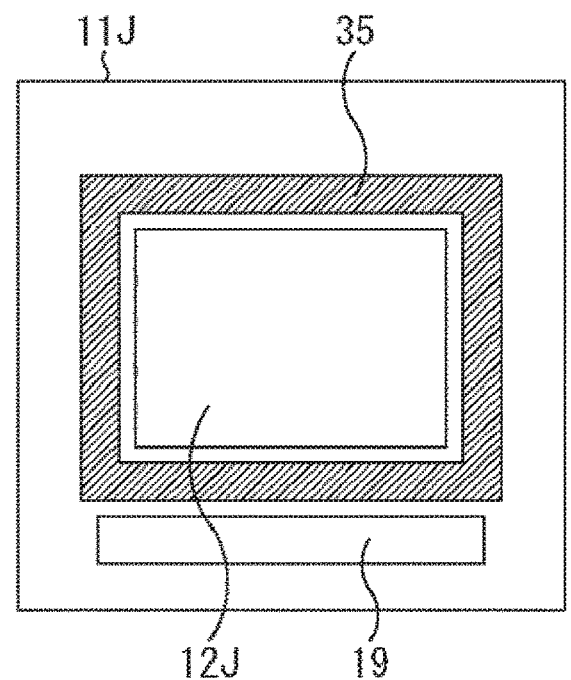
FIG. 13 is a diagram showing a configuration example of an embodiment of a semiconductor device to which the present technology is applied.

Next, FIG. 13 is a diagram showing a configuration example of one embodiment of a semiconductor device to which the present technology is applied.

As shown in FIG. 13, in a semiconductor device 11J, a high-sensitivity analog element region 12J is formed in place of the pixel region 12 of the solid state imaging element 11 shown in FIG. 4. That is, in the semiconductor device 11J, a plurality of high-sensitivity analog elements are arranged in the high-sensitivity analog element region 12J. In the semiconductor device 11J, the structure object 35 is placed so as to pass through the space to the peripheral circuit 19 placed near the high-sensitivity analog element region 12J and surround the high-sensitivity analog element region 12J in a planar view.

In the semiconductor device 11J thus configured, light generated in the active element 34 of the peripheral circuit 19 can be prevented from entering the high-sensitivity analog element region 12J. Therefore, adverse effects such as a change in the value retained by the high-sensitivity analog elements arranged in the high-sensitivity analog element region 12J due to light generated by hot carriers can be suppressed. In the semiconductor device 11J, any of the structures shown in FIG. 3 and FIGS. 5 to 9 may be employed as the cross-sectional configuration of the structure object 35, and any of the placement examples shown in FIGS. 10 to 12 may be employed as the planar placement example of the structure object 35.

As a modification example of the semiconductor device 11J, a configuration in which a plurality of pixels are formed in part of the high-sensitivity analog element region 12J and the high-sensitivity analog element region 12J and a pixel region are juxtaposed is possible, for example. That is, the structure object 35 is placed so as to surround both the high-sensitivity analog element region 12J and the pixel region; thereby, the adverse effects on the high-sensitivity analog element and the pixel due to light generated by hot carriers can be suppressed. In such a configuration, any of the structures shown in FIG. 3 and FIGS. 5 to 9 may be employed as the cross-sectional configuration of the structure object 35, and any of the placement examples shown in FIGS. 10 to 12 may be employed as the planar placement example of the structure object 35.

Figure 14:
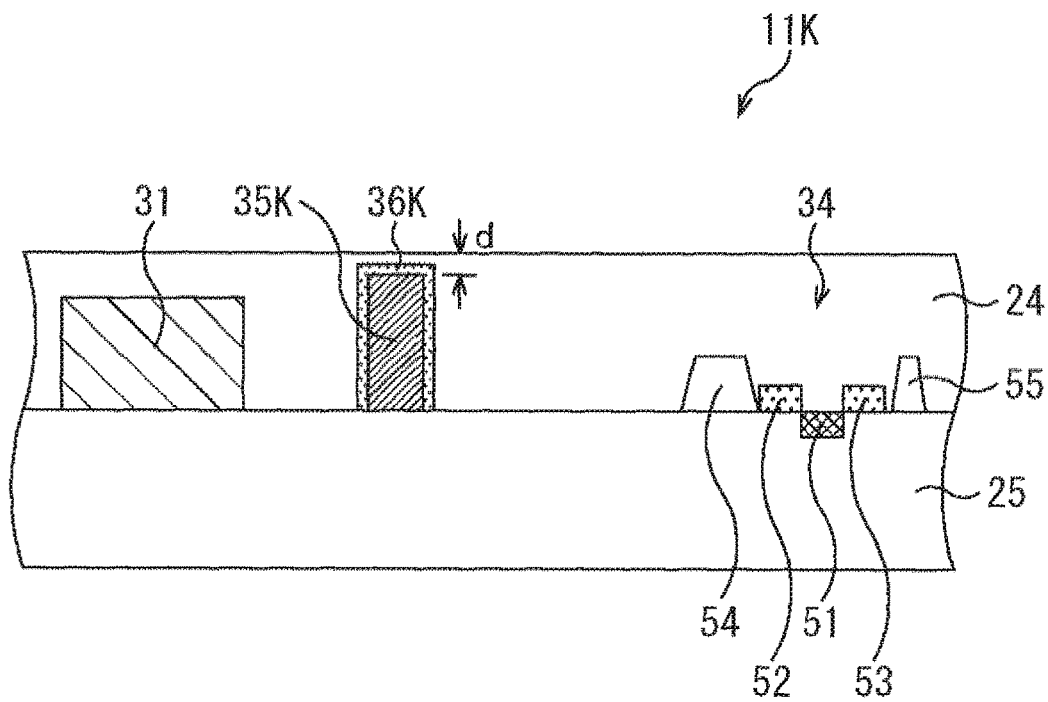
FIG. 14 is a diagram showing a cross-sectional configuration example in a second embodiment of the solid state imaging element to which the present technology is applied.

Next, FIG. 14 is a diagram showing a cross-sectional configuration example in a second embodiment of the solid state imaging element to which the present technology is applied.

As shown in FIG. 14, in a solid state imaging element 11K, a metal structure object 35K and an insulator 36K formed between the active element 34 and the light receiving element 31 have a configuration different from that in the solid state imaging element 11 of FIG. 3. Otherwise, the configuration of the solid state imaging element 11K is similar to the configuration of the solid state imaging element 11 of FIG. 3, and a detailed description thereof is omitted.

That is, while in the solid state imaging element 11 of FIG. 3 the structure object 35 is formed of a material that refracts or absorbs light, in the solid state imaging element 11K the metal structure object 35K is formed of a metal that reflects light and the insulator 36K is formed so as to surround the periphery of the metal structure object 35K. The metal structure object 35K is formed by digging the front surface (the surface facing down in FIG. 14) of the element formation unit 24, and has a configuration in which the spacing d of the gap between the tip of the metal structure object 35K and the back surface of the element formation unit 24 is a short wavelength (e.g. approximately 400 nm) or less, similarly to the structure object 35.

As the material of the metal structure object 35K, for example, a material that sufficiently reflects light in the visible light region, such as copper (Cu), aluminum (Al), tungsten (W), titanium (Ti), or tantalum (Ta), may be used. Although not shown, an electrode for extracting the electric potential of the metal structure object 35K is provided at the metal structure object 35K.

Therefore, also in the solid state imaging element 11K, light generated by hot carrier luminescence is reflected at the metal structure object 35K and can be prevented from passing through the gap on the tip side, like in the solid state imaging element 11 of FIG. 3. Thereby, the solid state imaging element 11K can avoid the incidence of light generated by hot carriers on the light receiving element 31, and can suppress the adverse effect due to the light.

Figure 15:
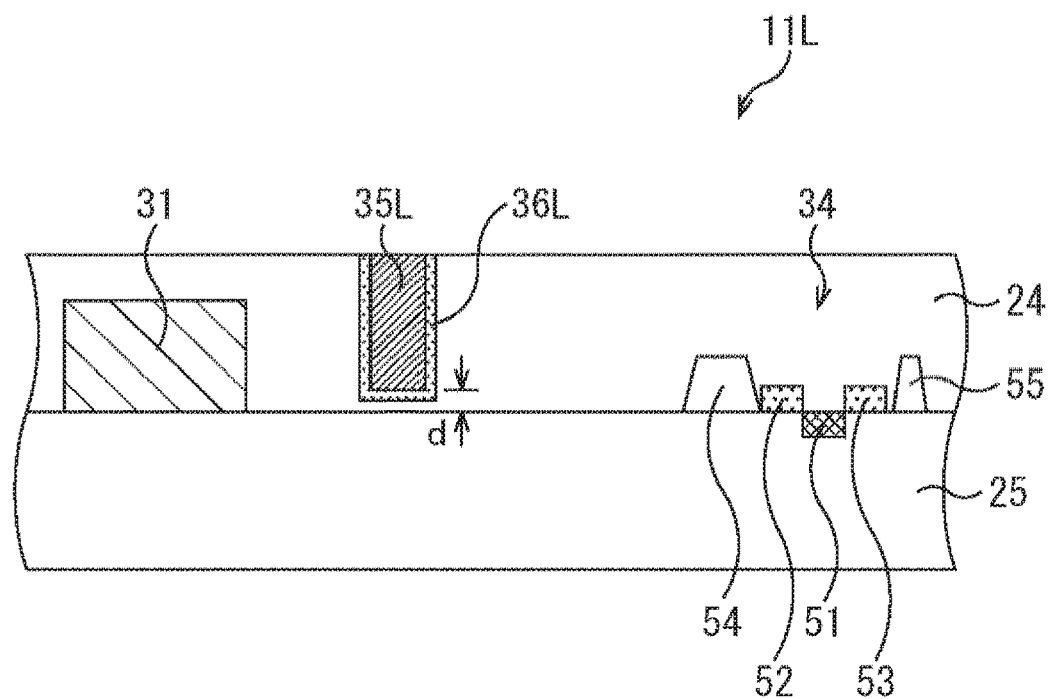
FIG. 15 is a diagram showing a first modification example in the second embodiment of the solid state imaging element.

Next, a first modification example in the second embodiment of the solid state imaging element 11 is shown in FIG. 15.

As shown in FIG. 15, in a solid state imaging element 11L, a metal structure object 35L formed between the active element 34 and the light receiving element 31 has a configuration different from that in the solid state imaging element 11K of FIG. 14. Otherwise, the configuration of the solid state imaging element 11L is similar to the configuration of the solid state imaging element 11K of FIG. 14, and a detailed description thereof is omitted.

That is, while in the solid state imaging element 11K of FIG. 14 the metal structure object 35K is formed by digging the front surface side of the element formation unit 24, in the solid state imaging element 11L the metal structure object 35L is formed by digging the back surface side of the element formation unit 24. The metal structure object 35L is formed of a material that reflects light, and has a configuration in which the spacing d of the gap between the tip of the metal structure object 35L and the front surface of the element formation unit 24 is a short wavelength (e.g. approximately 400 nm) or less, similarly to the structure object 35K.

Therefore, also in the solid state imaging element 11L, light generated by hot carrier luminescence is reflected at the structure object 35L and can be prevented from passing through the gap on the tip side, like in the solid state imaging element 11K of FIG. 14. Thereby, the solid state imaging element 11L can avoid the incidence of light generated by hot carriers on the light receiving element 31, and can suppress the adverse effect due to the light.

Figure 16:
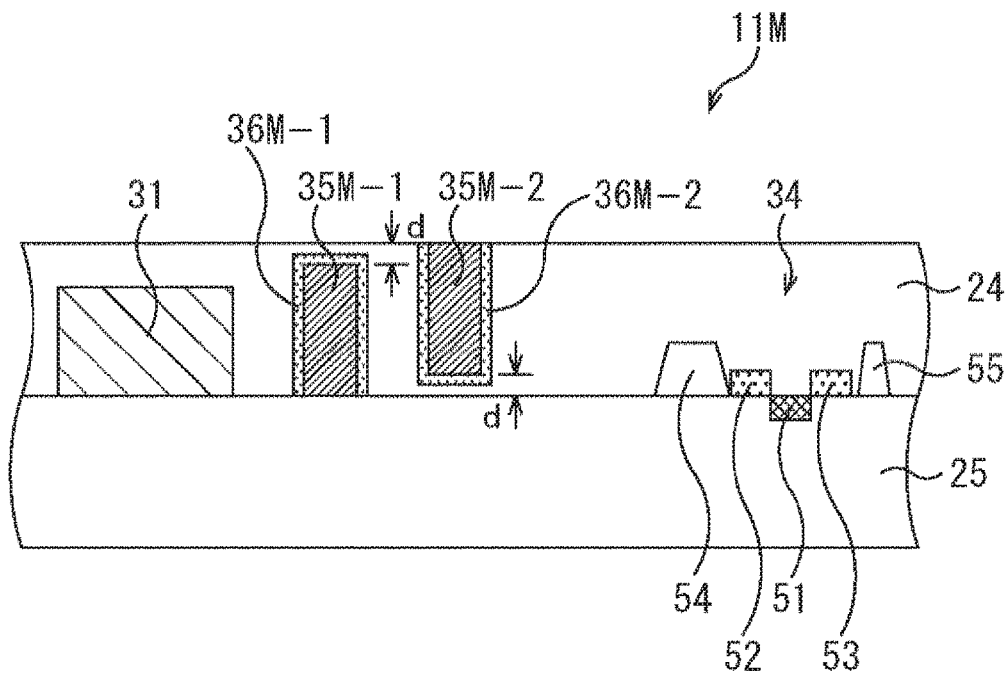
FIG. 16 is a diagram showing a second modification example in the second embodiment of the solid state imaging element.

Next, a second modification example in the second embodiment of the solid state imaging element 11 is shown in FIG. 16.

As shown in FIG. 16, in a solid state imaging element 11M, metal structure objects 35M-1 and 35M-2 formed between the active element 34 and the light receiving element 31 have a configuration different from that in the solid state imaging element 11K of FIG. 14. Otherwise, the configuration of the solid state imaging element 11M is similar to the configuration of the solid state imaging element 11K of FIG. 14, and a detailed description thereof is omitted.

That is, while in the solid state imaging element 11K of FIG. 14 one metal structure object 35K is formed in the element formation unit 24, in the solid state imaging element 11M two metal structure objects 35M-1 and 35M-2 are formed in the element formation unit 24. The structure object 35M-1 is formed from the back surface side of the element formation unit 24, and the structure object 35M-2 is formed from the front surface side of the element formation unit 24. Thus, the structure object 35M-1 and the structure object 35M-2 overlap when the light receiving element 31 is viewed from the active element 34, and thereby the structure object 35M-1 and the structure object 35M-2 are configured so that light does not slip through the gap on each tip side in a straight line.

By thus configuring the structure object 35M-1 and the structure object 35M-2, the spacing d of the gap between the back surface of the element formation unit 24 and the tip of the structure object 35M-1 and the spacing d of the gap between the front surface of the element formation unit 24 and the tip of the structure object 35M-2 do not need to be suppressed to approximately a short wavelength. It is effective to employ the configuration of the solid state imaging element 11M when, for example, it is difficult to control the gap to the front surface or the back surface for reasons of process processing variations etc.

Therefore, also in the solid state imaging element 11M, light generated by hot carrier luminescence is reflected at the metal structure objects 35M-1 and 35M-2 and can be prevented from passing through the gap on the tip side, like in the solid state imaging element 11K of FIG. 14. Thereby, the solid state imaging element 11M can avoid the incidence of light generated by hot carriers on the light receiving element 31, and can suppress the adverse effect due to the light.

Figure 17:
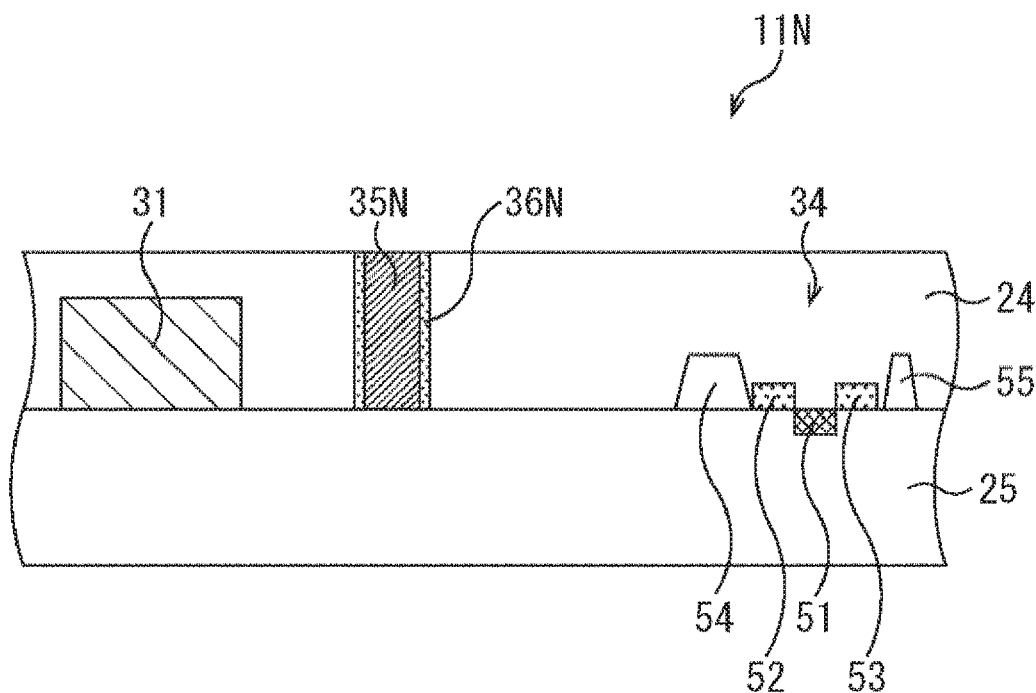
FIG. 17 is a diagram showing a third modification example in the second embodiment of the solid state imaging element.

Next, a third modification example in the second embodiment of the solid state imaging element 11 is shown in FIG. 17.

As shown in FIG. 17, in a solid state imaging element 11N, a metal structure object 35N formed between the active element 34 and the light receiving element 31 has a configuration different from that in the solid state imaging element 11K of FIG. 14. Otherwise, the configuration of the solid state imaging element 11N is similar to the configuration of the solid state imaging element 11K of FIG. 14, and a detailed description thereof is omitted.

That is, while in the solid state imaging element 11K of FIG. 14 the metal structure object 35K is formed by digging the front surface side of the element formation unit 24, in the solid state imaging element 11N the metal structure object 35N is formed so as to penetrate from the front surface side to the back surface side of the element formation unit 24. That is, in the solid state imaging element 11N, the metal structure object 35N is formed without a gap being formed in the thickness direction of the element formation unit 24. The metal structure object 35N is formed of a material that reflects light, similarly to the structure object 35K.

Therefore, also in the solid state imaging element 11N, light generated by hot carrier luminescence is reflected at the metal structure object 35N, like in the solid state imaging element 11K of FIG. 14. Thereby, the solid state imaging element 11N can avoid the incidence of light generated by hot carriers on the light receiving element 31, and can suppress the adverse effect due to the light. Furthermore, in the solid state imaging element 11N, control such as providing the spacing d at the time of digging the element formation unit 24 during the formation of the metal structure object 35N, like in the solid state imaging element 11K of FIG. 14, is not needed; thus, the metal structure object 35N can be formed easily.

Any of the placement examples shown in FIG. 4 and FIGS. 10 to 12 may be employed as the planar placement example of the metal structure objects 35K to 35N. The metal structure objects 35K to 35N may be used for the semiconductor device 11J shown in FIG. 13.

Figure 18:
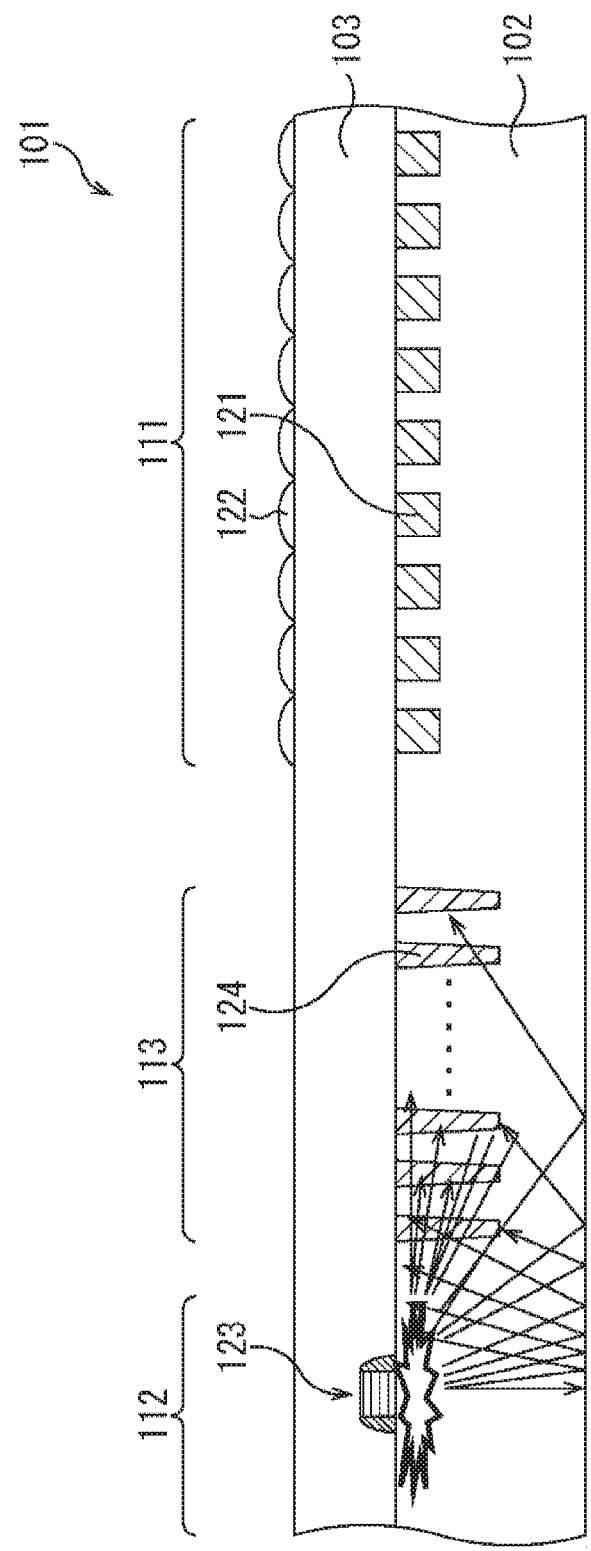
FIG. 18 is a diagram showing a cross-sectional configuration example in a third embodiment of the solid state imaging element to which the present technology is applied.

FIG. 18 is a diagram showing a cross-sectional configuration example in a third embodiment of the solid state imaging element to which the present technology is applied.

As shown in FIG. 18, in a solid state imaging element 101, a silicon oxide film 103 that is an interconnection unit is stacked on a silicon substrate 102 that is an element formation unit. In the solid state imaging element 101, a pixel region 111 and a peripheral circuit 112 placed around the pixel region 111 are provided, like in the solid state imaging element 11 described with reference to FIG. 1 and FIG. 2. A plurality of light receiving elements 121 and on-chip lenses 122 are arranged in the pixel region 111, and the peripheral circuit 112 is formed of an active element 123. The solid state imaging element 101 is a front-side illumination solid state imaging element in which light is applied to the light receiving element 121 from the side of the front surface that is a surface at which the active element 123 is formed on the silicon substrate 102.

Also in the solid state imaging element 101, a structure object 124 formed of a material that inhibits the propagation of light is formed between the pixel region 111 and the peripheral circuit 112, like in the solid state imaging element 11 described above. As shown in the drawing, a plurality of structure objects 124 are formed in the solid state imaging element 101; and the region where the structure objects 124 are formed is referred to as a structure object formation region 113. As the material of the structure object 124, for example, silicon nitride (SiN), air, silicon dioxide ($SiO_2$), or the like, which reflects light by means of the refractive index with respect to the silicon substrate 102, may be used.

Thus, in the solid state imaging element 101, by placing a plurality of structure objects 124 between the pixel region 111 and the peripheral circuit 112, the degree to which light caused by hot carrier luminescence generated when the active element 123 is in drive arrives at the light receiving element 121 can be reduced. That is, light generated in the active element 123 is reflected by a plurality of structure objects 124 and thereby the optical distance up to the arrival at the light receiving element 121 is increased, thus, the light is absorbed in the silicon substrate 102.

For the solid state imaging element 101 of such a configuration, the light blocking effect of the structure object 124 is verified by simulations with the number, depth, pitch, and material of structure objects 124 as parameters.

First, the conditions of the simulations of light blocking effect in the solid state imaging element 101 are described with reference to FIG. 19 to FIG. 21.

Figure 19:
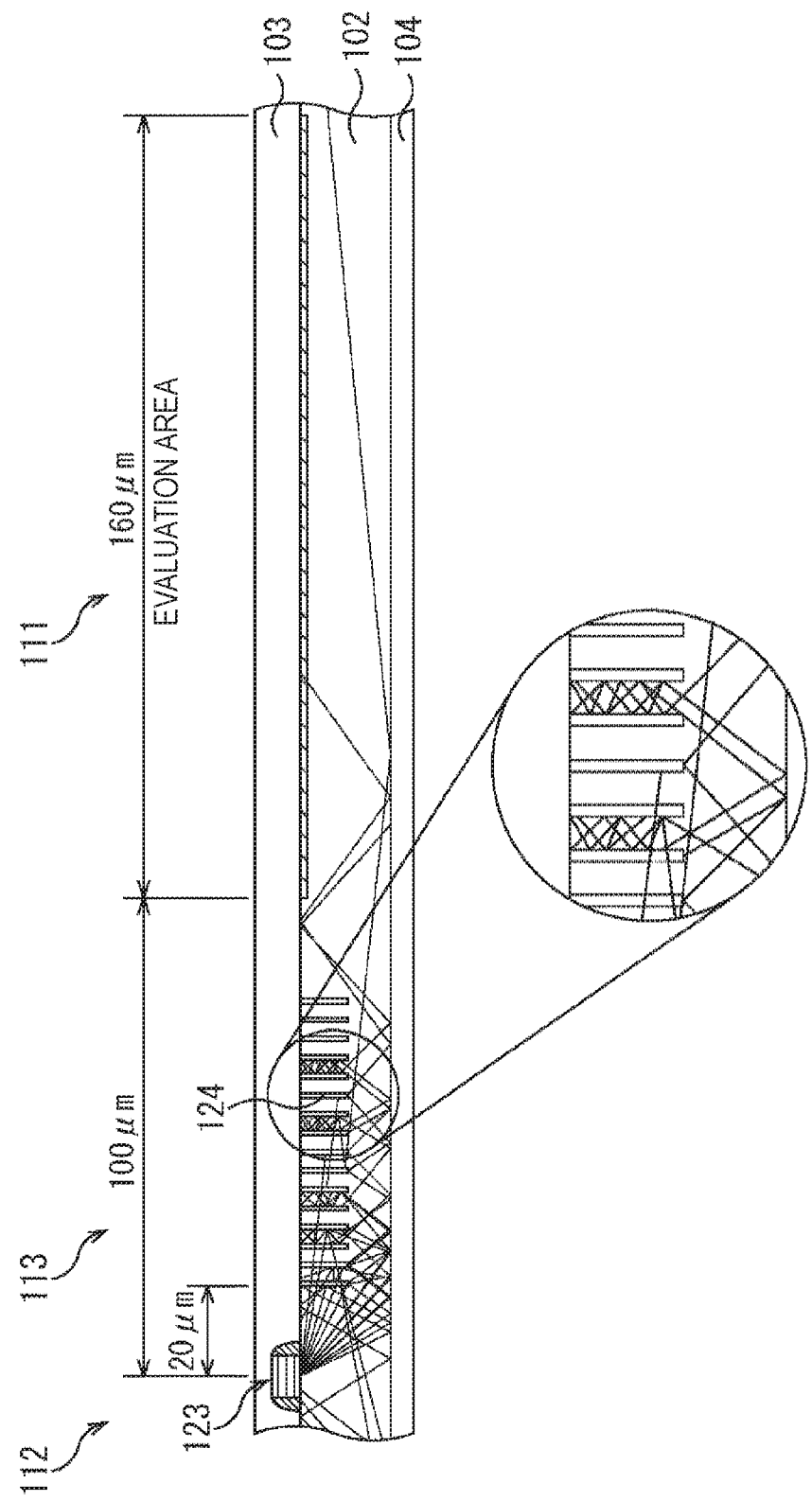
FIG. 19 is a diagram showing a cross-sectional configuration example of a solid state imaging element used in simulations.

In FIG. 19, a cross-sectional configuration example of the solid state imaging element 101 used for the simulations is shown. As shown in the drawing, a configuration in which the silicon substrate 102 is stacked on a resin layer 104 is employed, and the thickness of the silicon substrate 102 is set to 17 μm. The spacing from the active element 123, which is a light source of hot carrier luminescence, to an end of the structure object formation region 113 including a plurality of structure objects 124 is set to 20 μm, and the spacing from the active element 123 to an end of the pixel region 111 including a plurality of light receiving elements 121 is set to 100 μm. The irradiance distribution in the area extending 160 μm from the end of the pixel region 111 (hereinafter, referred to as an evaluation area) was calculated. Lambertian, which is a property that an ideal diffuse reflecting surface should have, was assumed for the light distribution of hot carrier luminescence.

In FIG. 20, the refractive index n and the attenuation coefficient k of each material are shown. For example, the refractive index n of the silicon oxide film 103 ($SiO_2$) is 1.45, and the attenuation coefficient k thereof is 0. The refractive index n of the silicon substrate 102 (Si) is 3.6, and the attenuation coefficient k thereof is 0.001; and the refractive index n of the resin layer 104 is 1.54, and the attenuation coefficient k thereof is 0. The refractive index n when silicon nitride (SiN) is used as the material of the structure object 124 is 1.84, and the attenuation coefficient k in this case is 0; the refractive index n when tungsten (W) is used is 3.05, and the attenuation coefficient k in this case is 3.39; and the refractive index n when air is used is 1, and the attenuation coefficient k in this case is 0.

As shown in FIG. 21, as simulation conditions as a standard, the depth of the structure object 124 is set to 3 μm, the number of structure objects 124 is set to 30, the pitch is set to 1 μm, and silicon nitride (SiN) is used as the material. As a first simulation condition, the depth of the structure object 124 out of the simulation conditions as the standard is taken as a parameter, and the depth of the structure object 124 is altered to 6 μm and 10 μm. As a second simulation condition, the number of structure objects 124 out of the simulation conditions as the standard is taken as a parameter, and the number of structure objects 124 is altered to 45 and 60.

As a third simulation condition, the pitch of the structure objects 124 out of the simulation conditions as the standard is taken as a parameter, and the pitch of the structure objects 124 is altered to 1.5 μm and 2 μm. As a fourth simulation condition, the material of the structure object 124 out of the simulation conditions as the standard is taken as a parameter, and air, silicon dioxide ($SiO_2$), and tungsten (W) are used as the material of the structure object 124.

Using the simulation conditions, the irradiance distribution in the evaluation area shown in FIG. 19 and the integrated value of the irradiance distribution are calculated. Then, for comparison with a conventional solid state imaging element, that is, a structure in which the structure object 124 is not provided, the value found in each simulation condition is normalized assuming that the irradiance distribution and the integrated value in the structure in which the structure object 124 is not provided are 1.

The light blocking effect in each simulation condition will now be described with reference to FIG. 22 to FIG. 26.

Figure 22:
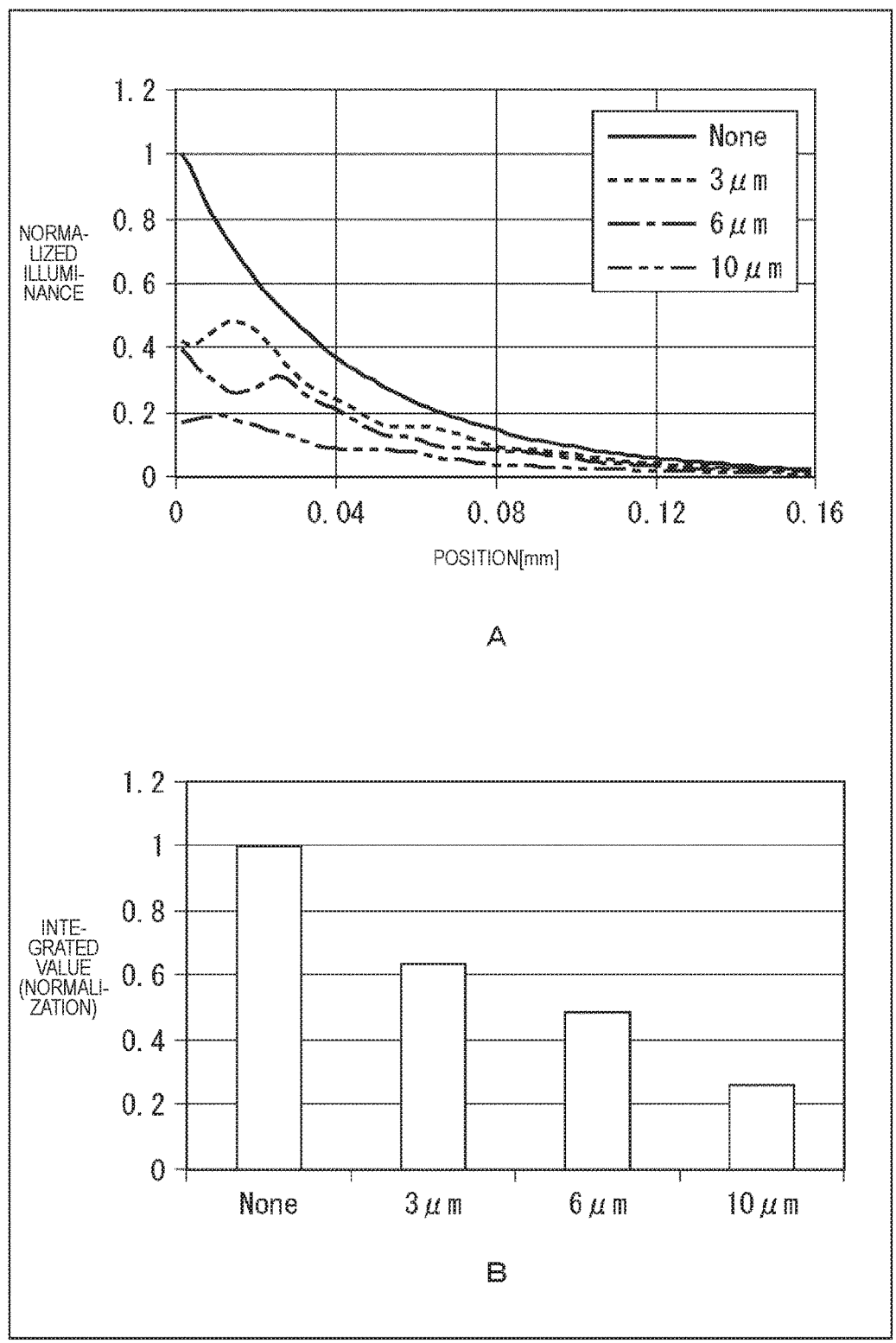
FIG. 22 is a diagram showing the results of a simulation of light blocking effect with the depth of the structure object as a parameter.

FIG. 22 shows the results of a simulation of light blocking effect when the depth of the structure object 124 is taken as a parameter and the depth is set to 3 μm, 6 μm, and 10 μm. In A of FIG. 22, the vertical axis represents the normalized illuminance and the horizontal axis represents the position in the evaluation area; and in B of FIG. 22, the vertical axis represents the integrated value (normalization) of the illuminance, and the horizontal axis represents each depth.

As shown in FIG. 22, by providing the structure object 124, the illuminance in the evaluation area can be reduced as compared to the structure in which the structure object 124 is not provided (None). It is shown that the light blocking effect is improved more as the depth of the structure object 124 is set deeper.

Thus, to obtain better light blocking effect, it is preferable to form the structure object 124 with the depth set deeper. Even in a configuration in which the depth is shallow (3 μm), sufficient light blocking effect as compared to the structure in which the structure object 124 is not provided can be obtained by employing a configuration in which a plurality of structure objects 124 are placed.

As shown in A of FIG. 22, since light generated by hot carrier luminescence is absorbed in the silicon substrate 102, the irradiance decreases in the evaluation area with distance from the peripheral circuit 112 (as the position on the horizontal axis becomes a larger value). In other words, in the solid state imaging element 101, a plurality of structure objects 124 are placed to increase the optical path length from the peripheral circuit 112 to the pixel region 111 to attenuate the energy of light; thus, light blocking effect can be obtained.

That is, as shown in FIG. 19, part of the light derived from the active element 123 as a light source is incident on the first structure object 124, that is, the structure object 124 nearest to the active element 123, and undergoes total reflection or Fresnel reflection and is reflected to the peripheral circuit 112 side; thus, the arrival at the pixel region 111 is avoided. Light that has not been incident on the first structure object 124 enters the gap between adjacent structure objects 124, undergoes total reflection repeatedly between the silicon and the structure objects 124 (e.g. SiN), and is emitted from the gap between the structure objects 124, as shown in FIG. 19. Thus, light is attenuated by the increase in the optical path length of light. Alternatively, approximately half of the light emitted from the gap between the structure objects 124 is emitted to the peripheral circuit 112 side, and consequently the light arriving at the pixel region 111 is reduced.

Figure 23:
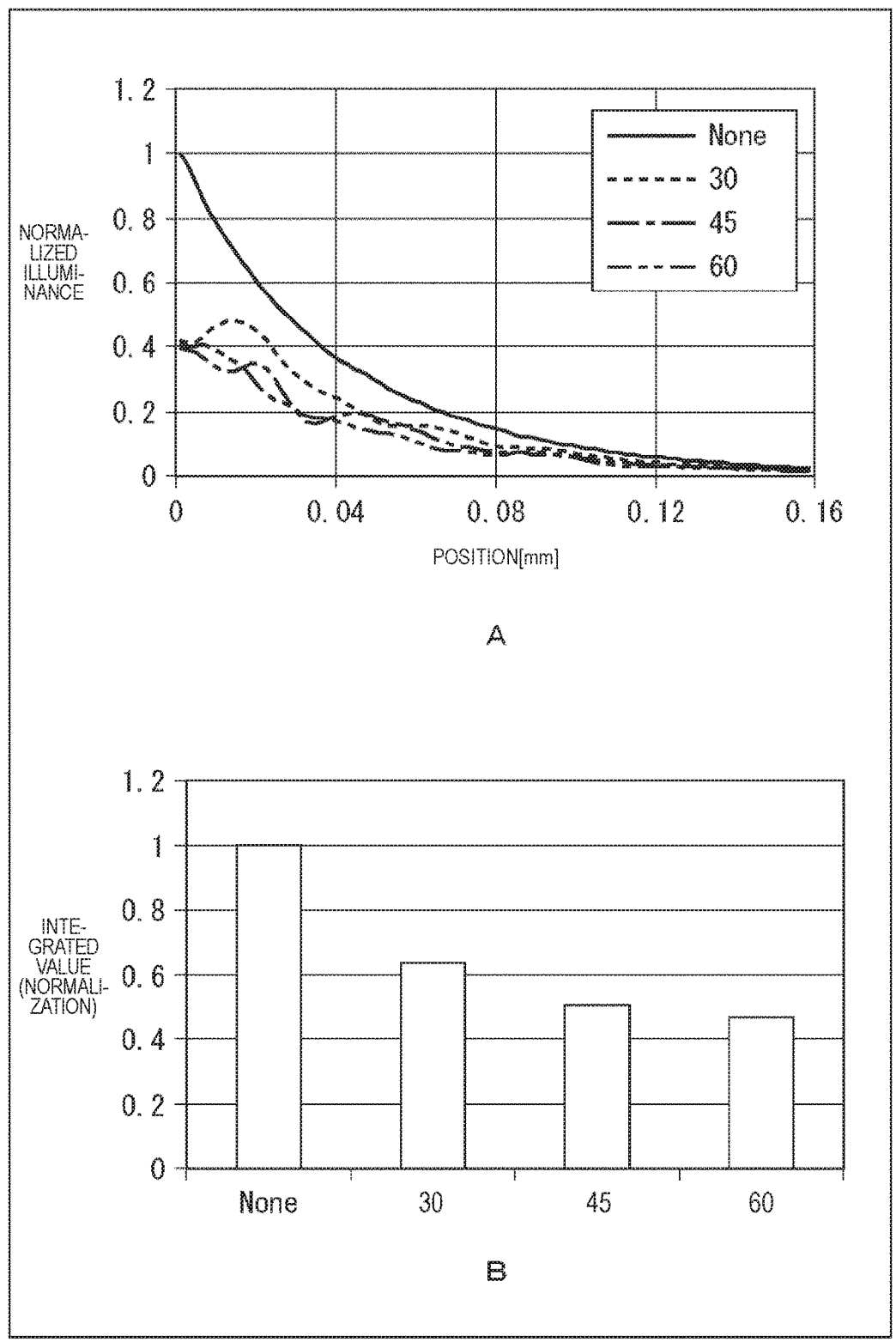
FIG. 23 is a diagram showing the results of a simulation of light blocking effect with the number of structure objects as a parameter.

Next, FIG. 23 shows the results of a simulation of light blocking effect when the number of structure objects 124 is taken as a parameter and the number is set to 30, 45, and 60. In A of FIG. 23, the vertical axis represents the normalized illuminance, and the horizontal axis represents the position in the evaluation area; and in B of FIG. 23, the vertical axis represents the integrated value (normalization) of the illuminance, and the horizontal axis represents the number.

As shown in FIG. 23, by providing a plurality of structure objects 124, the illuminance in the evaluation area can be reduced as compared to the structure in which the structure object 124 is not provided (None). It is shown that the light blocking effect is improved more as the number of structure objects 124 provided is set larger. Thus, to obtain better light blocking effect, it is preferable to provide a larger number of structure objects 124.

Figure 24:
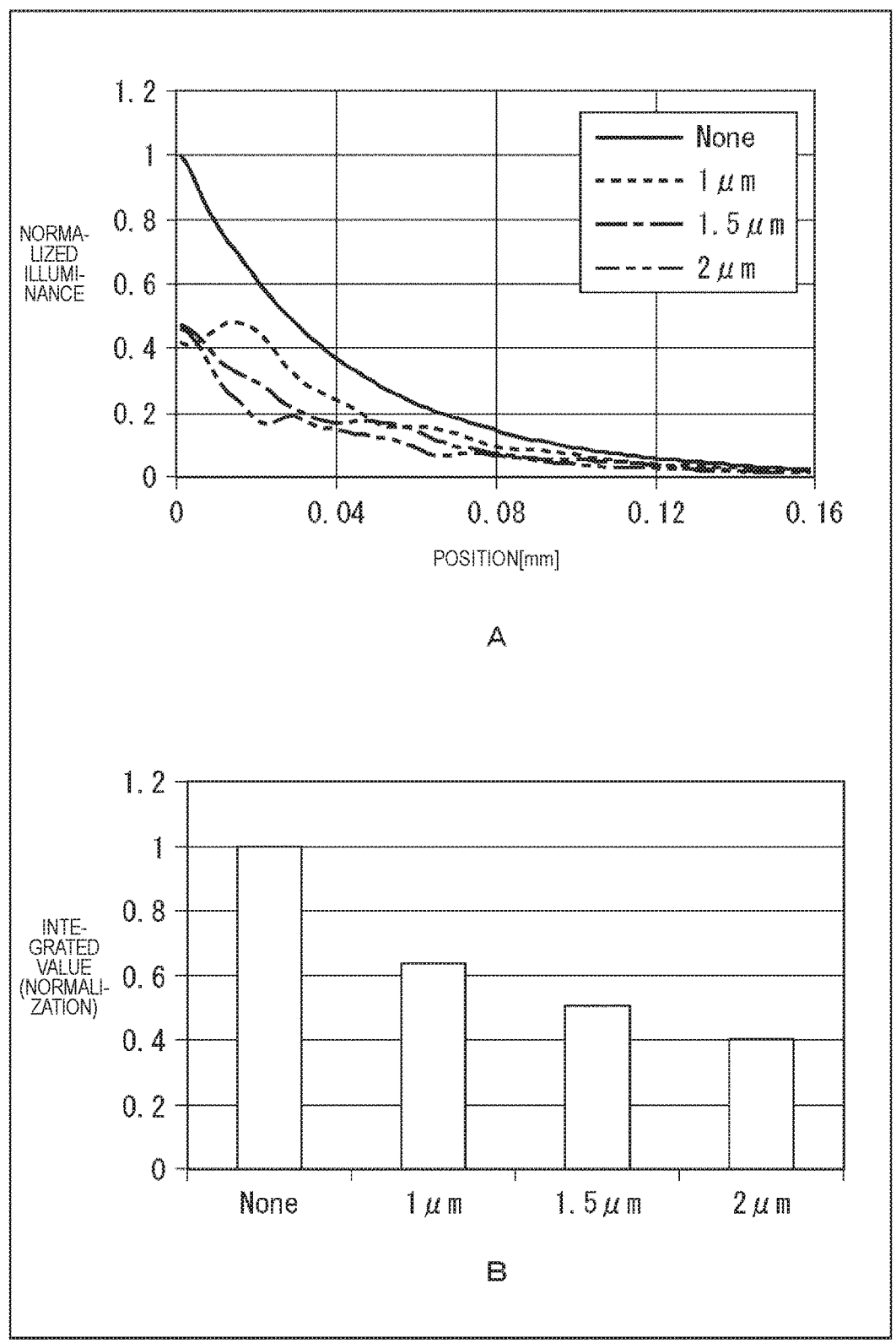
FIG. 24 is a diagram showing the results of a simulation of light blocking effect with the pitch of the structure objects as a parameter.

Next. FIG. 24 shows the results of a simulation of light blocking effect when the pitch of the structure object 124 is taken as a parameter and the pitch is set to 1 μm, 1.5 μm, and 2 μm. In A of FIG. 24, the vertical axis represents the normalized illuminance and the horizontal axis represents the position in the evaluation area; and in B of FIG. 24, the vertical axis represents the integrated value (normalization) of the illuminance, and the horizontal axis represents each pitch.

As shown in FIG. 24, by providing the structure objects 124 with a prescribed pitch, the illuminance in the evaluation area can be reduced as compared to the structure in which the structure object 124 is not provided (None). It is shown that the light blocking effect is improved more as the pitch with which the structure objects 124 are provided is set wider, that is, as the placement is made in a larger area when the same number of structure objects 124 are placed. Thus, to obtain better light blocking effect, it is preferable to provide the structure objects 124 with a wider pitch.

Figure 25:
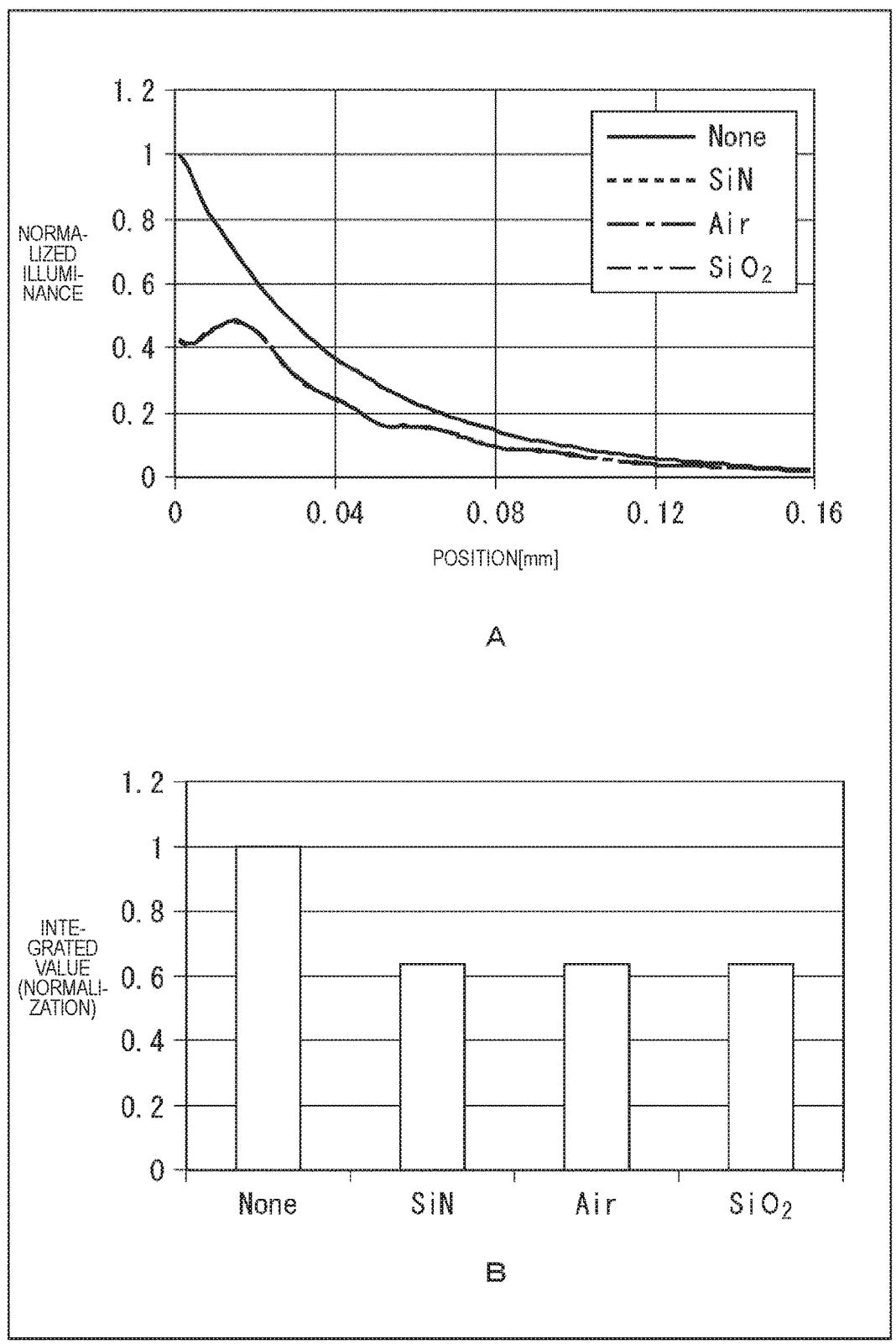
FIG. 25 is a diagram showing the results of a simulation of light blocking effect with the material of the structure object as a parameter.

Next, FIG. 25 shows the results of a simulation of light blocking effect when the material of the structure object 124 is taken as a parameter and silicon nitride (SiN), which reflects infrared light, air, and silicon dioxide ($SiO_2$) are used as the material. In A of FIG. 25, the vertical axis represents the normalized illuminance, and the horizontal axis represents the position in the evaluation area; and in B of FIG. 25, the vertical axis represents the integrated value (normalization) of the illuminance, and the horizontal axis represents each material.

As shown in FIG. 25, by providing the structure object 124 of any of the materials, the illuminance in the evaluation area can be reduced as compared to the structure in which the structure object 124 is not provided (None). It is shown that the difference due to the variation of the material of the structure object 124 is small, that is, almost the same light blocking effect is provided. This is because light blocking effect can be obtained sufficiently when providing the structure object 124 yields a refractive index difference of approximately 1.8 (for example, the refractive index difference between silicon and silicon nitride) as the reflection condition that changes with the change in the refractive index with respect to the interface of the silicon substrate 102.

Figure 26:
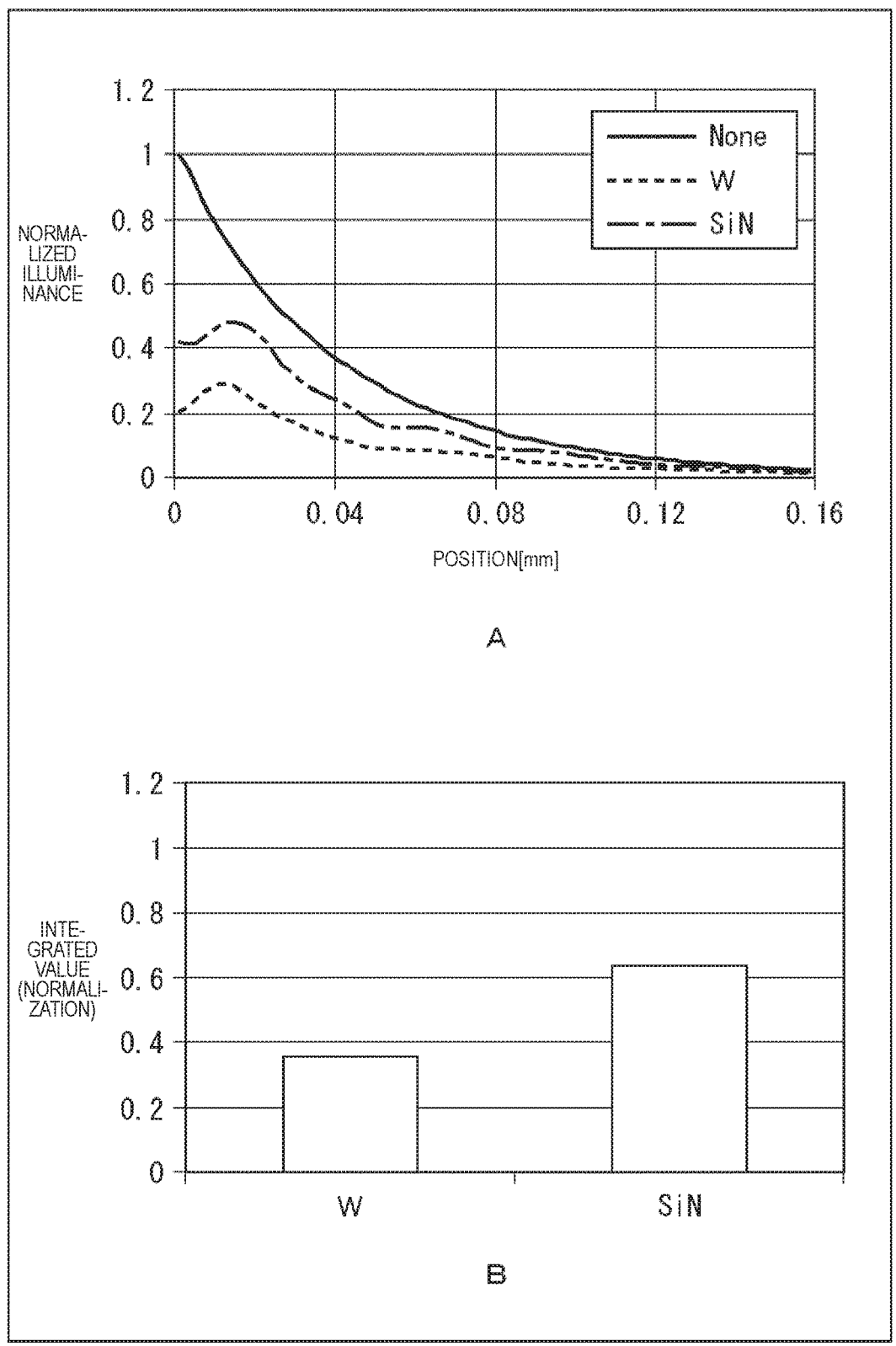
FIG. 26 is a diagram showing the results of a simulation of light blocking effect using a structure object of a material that absorbs infrared light.

Next, FIG. 26 shows the results of a simulation of light blocking effect when silicon nitride (SiN) and tungsten (W) are used as the material of the structure object 124. In A of FIG. 26, the vertical axis represents the normalized illuminance, and the horizontal axis represents the position in the evaluation area; and in B of FIG. 26, the vertical axis represents the integrated value (normalization) of the illuminance, and the horizontal axis represents each material.

By using tungsten as the material of the structure object 124, the structure object 124 has the effect of absorbing infrared light. Thus, it is shown that the light blocking effect is improved as compared to the configuration using silicon nitride, which does not have the effect of absorbing infrared light. That is, since not only is light absorbed in the silicon substrate 102 but light is absorbed also in the structure object 124, the light arriving at the evaluation area can be suppressed.

Thus, to obtain better light blocking effect, it is preferable to deepen the depth of the structure object 124, to increase the number of structure objects 124, and to widen the pitch of the structures objects 124. Furthermore, since the structure object 124 has the effect of absorbing infrared light, the light blocking effect can be improved more.

Figure 27:
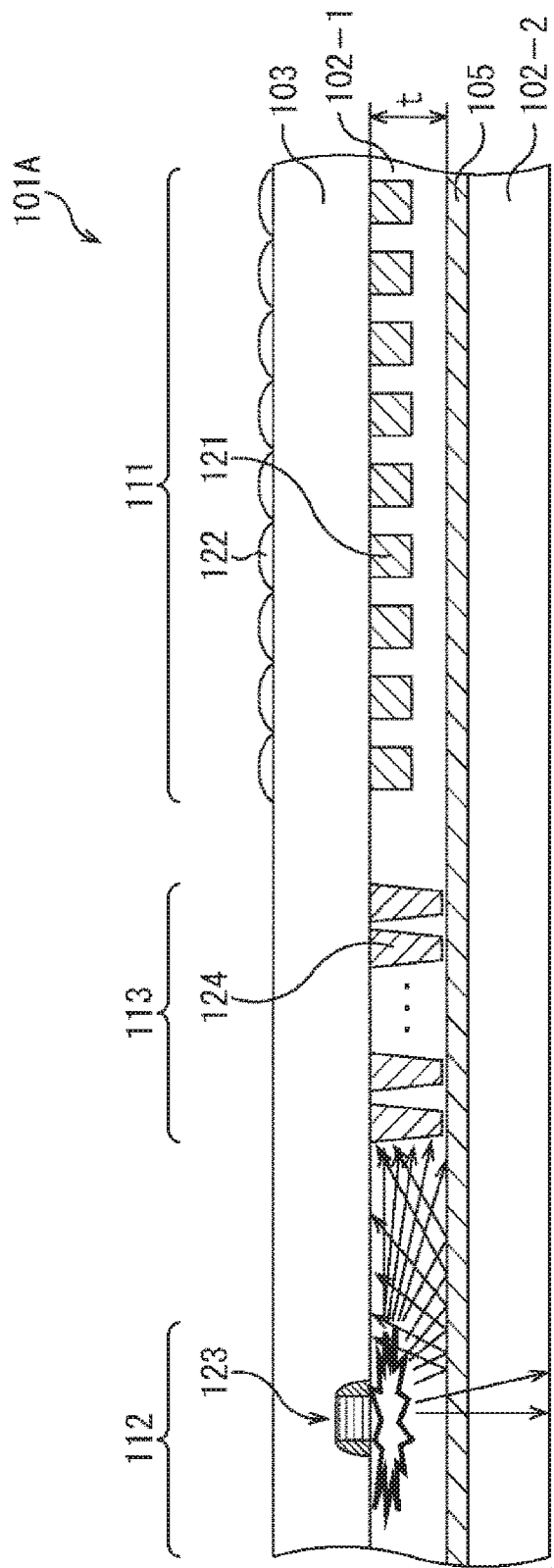
FIG. 27 is a diagram showing a first modification example in the third embodiment of the solid state imaging element.

Next, a first modification example of the solid state imaging element 101 is shown in FIG. 27. Hereinafter, in each modification example, configurations in common with the solid state imaging element 101 of FIG. 18 are marked with the same reference numerals, and a detailed description thereof is omitted as appropriate.

As shown in FIG. 27, in a solid state imaging element 101A, a substrate having a silicon-on-insulator (SOI) structure in which an insulating layer 105 is placed between silicon substrates 102-1 and 102-2 is used. As the insulating layer 105, a material with a different refractive index from silicon, for example with a lower refractive index of infrared light than silicon (e.g. $SiO_2$), is used.

Also in the solid state imaging element 101A, the structure object formation region 113 where a plurality of structure objects 124 are formed is provided between the pixel region 111 and the peripheral circuit 112, like in the solid state imaging element 101 of FIG. 18. For the structure object 124, a material that reflects infrared light like the above, namely, silicon nitride (SiN), air, and silicon dioxide ($SiO_2$) may be used. Thereby, in the solid state imaging element 101A, the light caused by hot carrier luminescence which arrives at the pixel region 111 can be reduced. The solid state imaging element 101A of such a structure has an advantage that back-side alignment (BSA) can be diverted to a light blocking structure.

Figure 28:
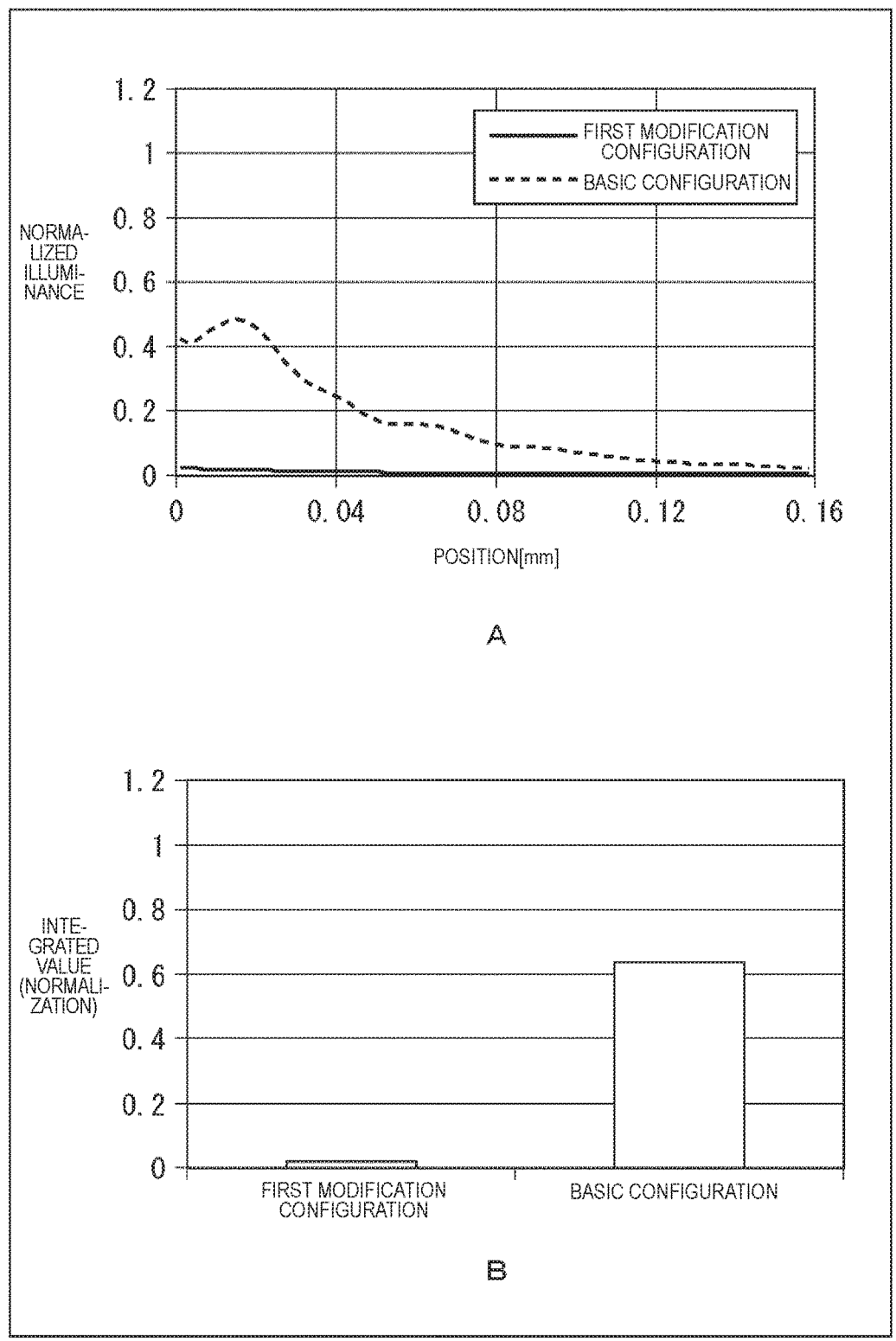
FIG. 28 is a diagram showing the results of a simulation of light blocking effect in a first modification configuration.

FIG. 28 shows the results of a simulation of light blocking effect of the solid state imaging element 101A. In the following description, the configuration of the solid state imaging element 101 of FIG. 18 is referred to as a basic configuration, and the configuration of the solid state imaging element 101A is referred to as a first modification configuration.

FIG. 28 shows the results of a simulation of light blocking effect when the depth of the structure object 124 is set to 3 μm, the number of structure objects 124 is set to 30, the pitch of the structure objects 124 is set to 1 μm, silicon nitride (SiN) is used as the material of the structure object 124, and the thickness t of the silicon substrate 102-1 is set to 3.1 μm. In A of FIG. 28, the vertical axis represents the normalized illuminance, and the horizontal axis represents the position in the evaluation area; and in B of FIG. 28, the vertical axis represents the integrated value (normalization) of the illuminance, and the horizontal axis represents the configuration of the solid state imaging element.

As shown in FIG. 28, the solid state imaging element 101A using an SOI structure (the first modification configuration) can obtain a higher light blocking effect than the solid state imaging element 101 using a silicon substrate (the basic configuration).

That is, as shown in FIG. 27, light incident on the insulating layer 105 at a prescribed incident angle or more is totally reflected at the insulating layer 105, and therefore most of the light generated in the active element 123 is totally reflected at the first structure object 124. Since the gap between the tip of the structure object 124 and the insulating layer 105 is approximately 0.1 μm, also light that has passed through the gap is attenuated due to the light blocking effect by a plurality of structure objects 124. Therefore, in the solid state imaging element 101A, the light arriving at the pixel region 111 can be significantly reduced as compared to the solid state imaging element 101.

The conditions to obtain more favorable light blocking effect in the configuration of the solid state imaging element 101A (the number, depth, pitch, and material of structure objects 124) are similar to those of the solid state imaging element 101 described above.

Figure 29:
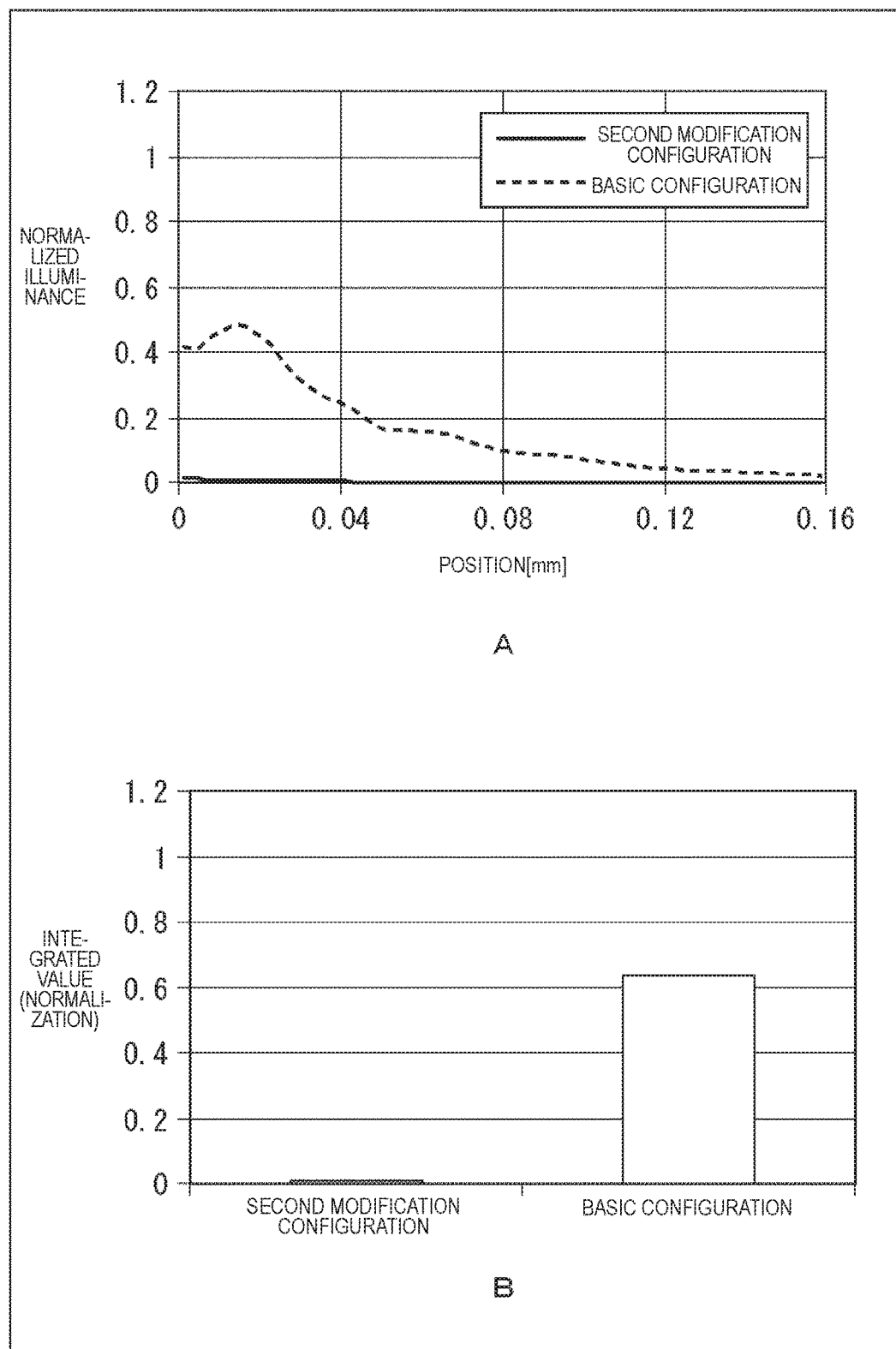
FIG. 29 is a diagram showing the results of a simulation of light blocking effect in a second modification configuration.

Next, FIG. 29 shows the results of a simulation of light blocking effect in a second modification example that is a structure in which tungsten, which absorbs infrared light, is used as the material of the structure object 124 in the structure of the solid state imaging element 101A of FIG. 27. In the following description, the configuration in which tungsten is used as the material of the structure object 124 in the configuration of the solid state imaging element 101A is referred to as a second modification configuration.

FIG. 29 shows the results of a simulation of light blocking effect when the depth of the structure object 124 is set to 3 μm, the number of structure objects 124 is set to 30, the pitch of the structure objects 124 is set to 1 μm, tungsten (W) is used as the material of the structure object 124, and the thickness t of the silicon substrate 102-1 is set to 3.1 μm. In A of FIG. 29, the vertical axis represents the normalized illuminance, and the horizontal axis represents the position in the evaluation area; and in B of FIG. 29, the vertical axis represents the integrated value (normalization) of the illuminance, and the horizontal axis represents the configuration of the solid state imaging element.

As shown in FIG. 29, in the configuration in which tungsten is used as the material of the structure object 124 and an SOI structure is used (the second modification configuration), a higher light blocking effect than that in the solid state imaging element 101 using a silicon substrate (the basic configuration) can be obtained. Furthermore, a higher light blocking effect than that in the solid state imaging element 101A in which silicon nitride is used as the material of the structure object 124 (the second modification configuration) can be obtained.

The conditions to obtain more favorable light blocking effect in the configuration in which tungsten is used as the material of the structure object 124 and an SOI structure is used (the second modification configuration) (the number, depth, and pitch of structure objects 124) are similar to those of the solid state imaging element 101 described above.

Figure 30:
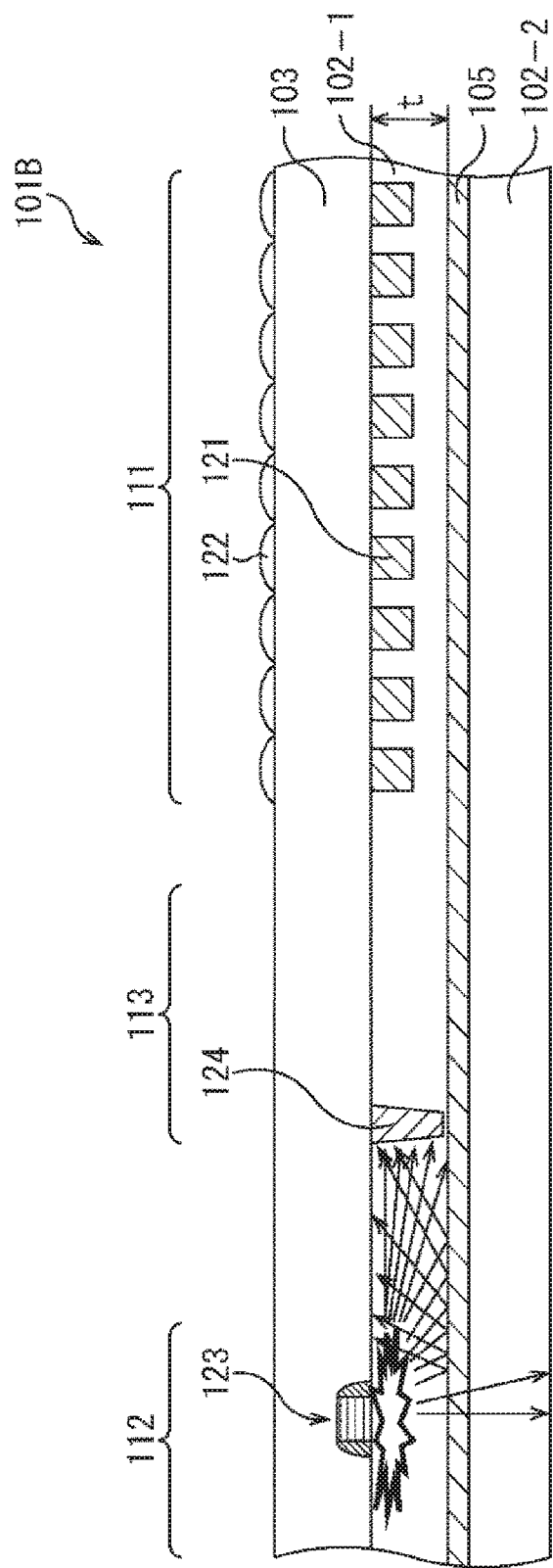
FIG. 30 is a diagram showing a third modification example in the third embodiment of the solid state imaging element.

Next, a third modification example of the solid state imaging element 101 is shown in FIG. 30.

As shown in FIG. 30, in a solid state imaging element 101B, a substrate having a silicon-on-insulator (SOI) structure in which the insulating layer 105 is placed between the silicon substrates 102-1 and 102-2 is used, like in the solid state imaging element 101A of FIG. 27. As the insulating layer 105, a material with a lower refractive index of infrared light than silicon (e.g. $SiO_2$) is used.

The solid state imaging element 101B has a configuration in which only one structure object 124 is placed in the structure object formation region 113 provided between the pixel region 111 and the peripheral circuit 112. In the solid state imaging element 101B, a material that absorbs infrared light like the above, namely, tungsten (W) may be used for the structure object 124. Thereby, in the solid state imaging element 101B, the light caused by hot carrier luminescence which arrives at the pixel region 111 can be reduced.

Figure 31:
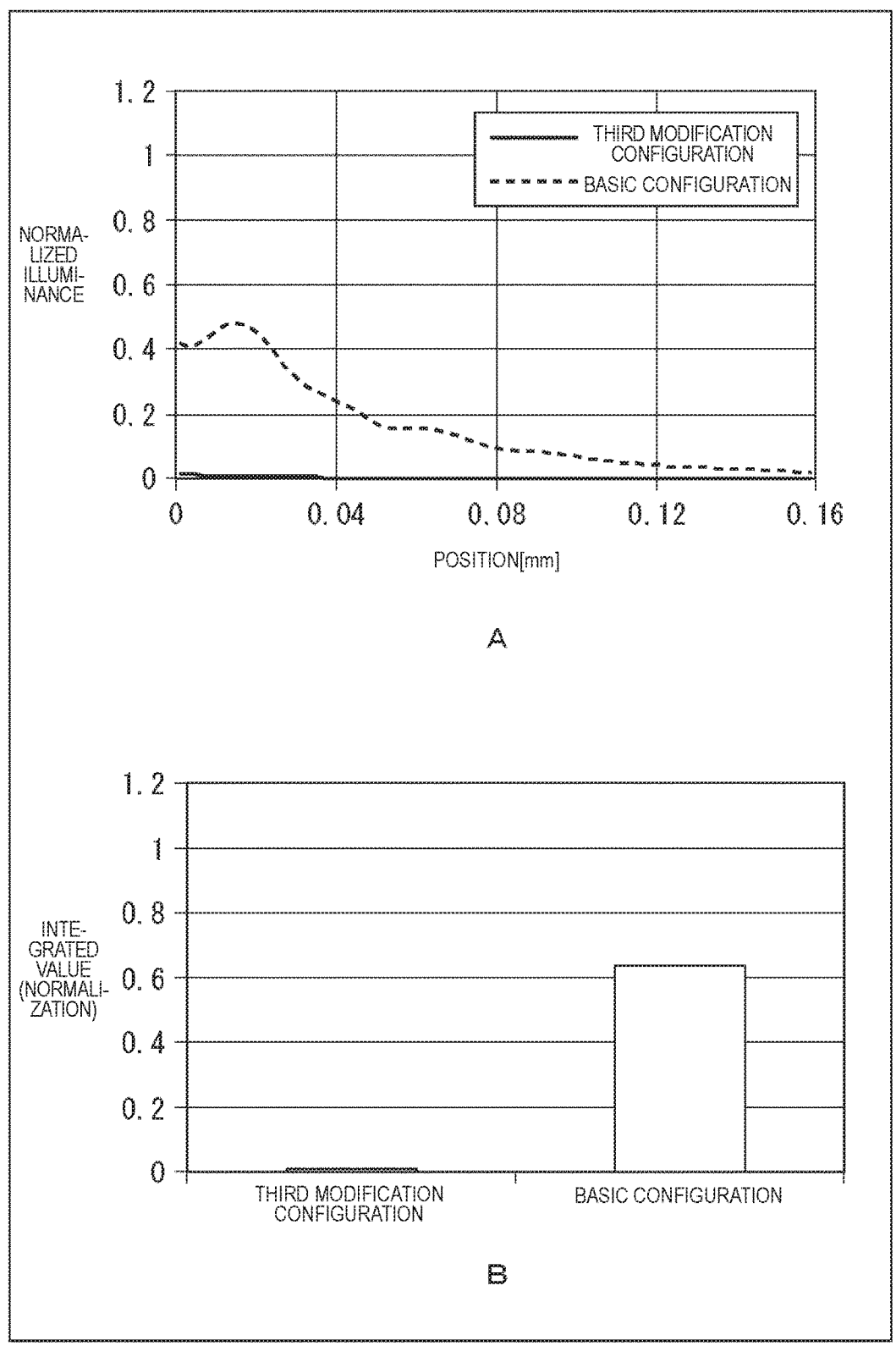
FIG. 31 is a diagram showing the results of a simulation of light blocking effect in a third modification configuration.

FIG. 31 shows the results of a simulation of light blocking effect of the solid state imaging element 101B. In the following description, the configuration of the solid state imaging element 101B is referred to as a third modification configuration.

FIG. 31 shows the results of a simulation of light blocking effect when the depth of the structure object 124 is set to 3 μm, the number of structure objects 124 is set to 30, the pitch of the structure objects 124 is set to 1 μm, tungsten (W) is used as the material of the structure object 124, and the thickness t of the silicon substrate 102-1 is set to 3.1 μm. In A of FIG. 31, the vertical axis represents the normalized illuminance, and the horizontal axis represents the position in the evaluation area; and in B of FIG. 31, the vertical axis represents the integrated value (normalization) of the illuminance, and the horizontal axis represents the configuration of the solid state imaging element.

As shown in FIG. 31, the solid state imaging element 101B in which an SOI structure is used and only one structure object 124 of a material that absorbs infrared light is placed (the third modification configuration) can obtain a higher light blocking effect than the solid state imaging element 101 using a silicon substrate (the basic configuration). Thus, the light passing through the tip side of the structure object 124 is reduced by using an SOI structure and light is absorbed by the structure object 124 by using a material that absorbs infrared light, thereby, sufficient light blocking effect can be obtained even when there is only one structure object 124.

The conditions to obtain more favorable light blocking effect in the configuration of the solid state imaging element 101B (the number, depth, and pitch of structure objects 124) are similar to those of the solid state imaging element 101 described above.

Figure 32:
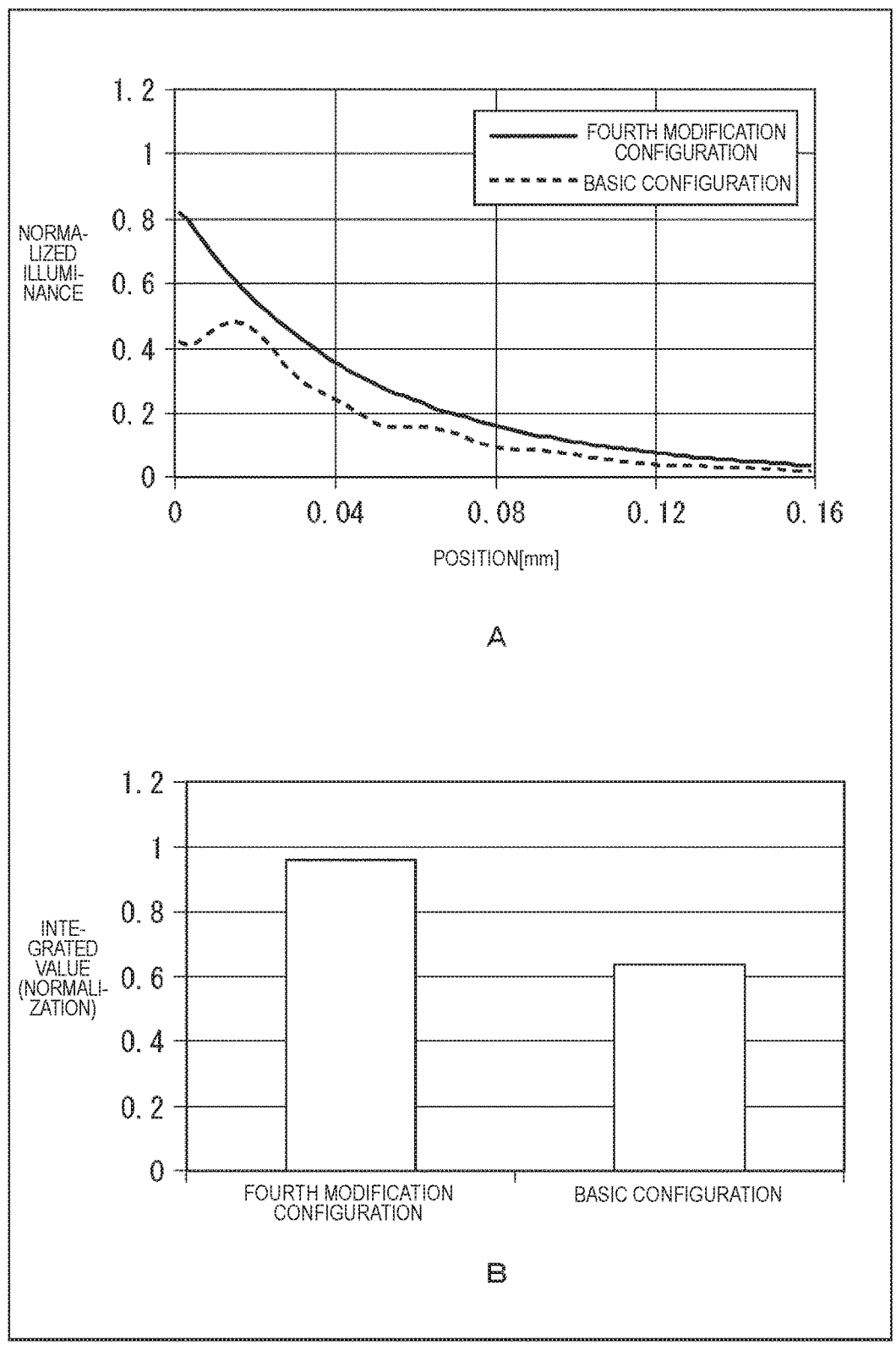
FIG. 32 is a diagram showing the results of a simulation of light blocking effect in a fourth modification configuration.

Next, FIG. 32 shows the results of a simulation of light blocking effect in a fourth modification example that is a structure in which a material that reflects infrared light (e.g. silicon nitride (SiN)) is used as the material of the structure object 124 in the structure of the solid state imaging element 101B. In the following description, the configuration in which silicon nitride is used as the material of the structure object 124 in the configuration of the solid state imaging element 101B is referred to as a fourth modification configuration.

As shown in FIG. 32, the solid state imaging element 101B in which an SOI structure is used and only one structure object 124 of a material that reflects infrared light is placed (the fourth modification configuration) appears to have a less good light blocking effect than the solid state imaging element 101 using a silicon substrate (the basic configuration). However, the illuminance of the fourth modification configuration is smaller, although to a limited degree, than the normalized value; thus, it is shown that light blocking effect is possessed as compared to the structure in which the structure object 124 is not provided (i.e., a conventional solid state imaging element).

Figure 33:
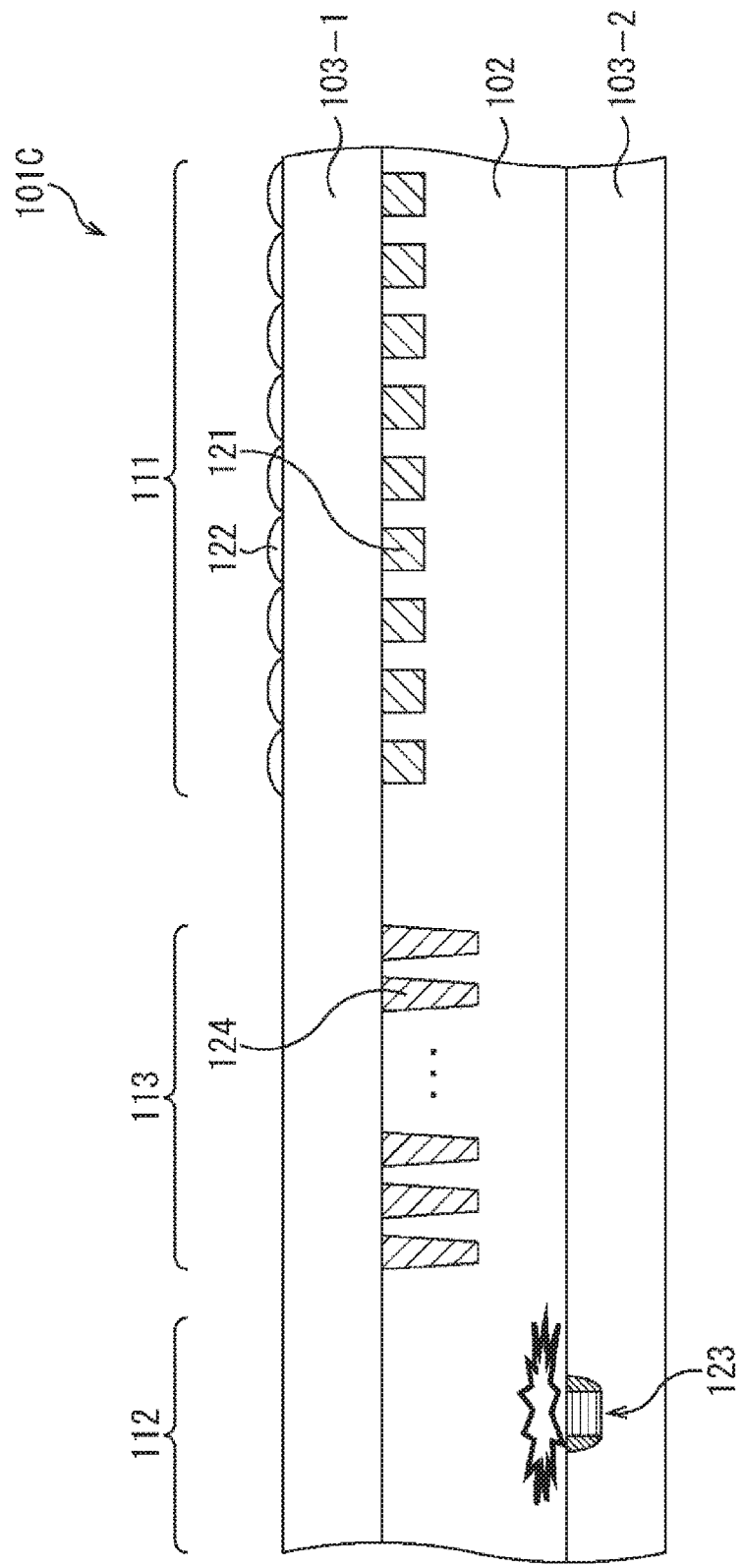
FIG. 33 is a diagram showing a fifth modification example in the third embodiment of the solid state imaging element.

Next, a fifth modification example of the solid state imaging element 101 is shown in FIG. 33.

A solid state imaging element 101C shown in FIG. 33 is a back-side illumination solid state imaging element in which light is applied to the light receiving element 121 from the back surface side that is on the opposite side to the side of the front surface that is a surface at which the active element 123 is formed on the silicon substrate 102. As shown in FIG. 33, in the solid state imaging element 101C, silicon oxide films 103-1 and 103-2 are stacked on both surfaces of the silicon substrate 102.

Also in the solid state imaging element 101C of such a configuration, the structure object formation region 113 in which a plurality of structure objects 124 are formed is provided between the pixel region Ill and the peripheral circuit 112, like in the solid state imaging element 101 of FIG. 18. Thereby, in the solid state imaging element 101C, the light caused by hot carrier luminescence which arrives at the pixel region 111 can be reduced. That is, the present technology can be applied to both the back-side illumination solid state imaging element and the front-side illumination solid state imaging element.

Next, planar placement examples of the structure object 124 in the solid state imaging element 101 are described with reference to FIG. 34 to FIG. 37.

Figure 34:
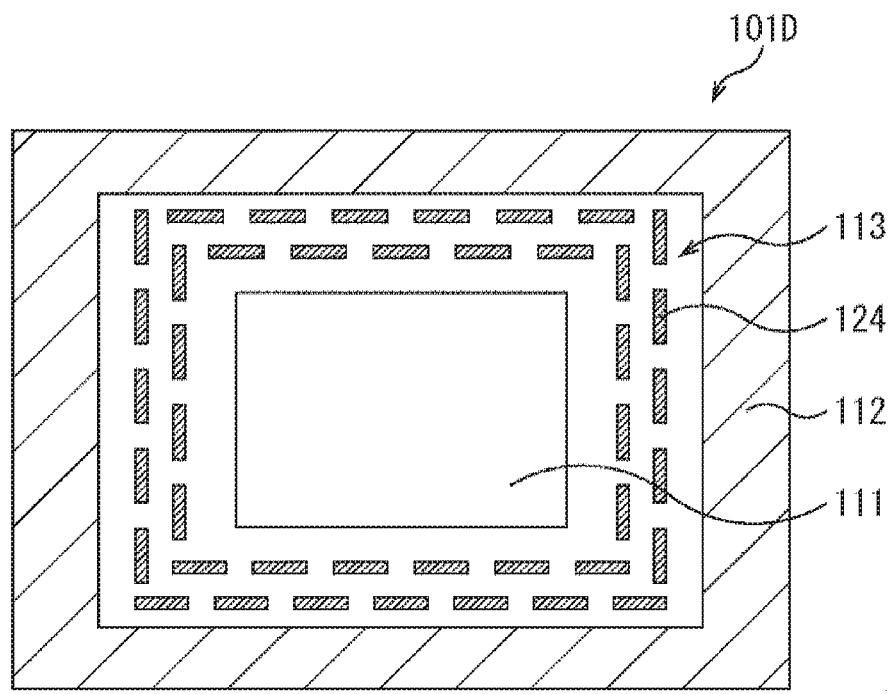
FIG. 34 is a diagram showing a first planar placement example of the structure object in the third embodiment of the solid state imaging element.

In FIG. 34, a first planar placement example of the structure object 124 in the solid state imaging element 101 is shown.

As shown in FIG. 34, in a solid state imaging element 101D, a structure object 124 divided into a plurality of pieces in the round direction is arranged doubly in the structure object formation region 113 so as to pass between the pixel region 111 and the peripheral circuit 112 and surround the pixel region 111 in a planar view. The structure object 124 divided into a plurality of pieces and arranged doubly is arranged such that adjacent structure objects 124 surround the pixel region 111 with a shift of a half period. That is, the outer structure objects 124 are arranged in correspondence to the gaps between inner structure objects 124, and the inner structure objects 124 are arranged in correspondence to the gaps between outer structure objects 124. By employing the structure in which structure objects 124 are thus arranged, the structure object 124 is surely placed in a straight line from the peripheral circuit 112 toward the pixel region 111; therefore, the direct arrival of light at the pixel region 111 from the peripheral circuit 112 can be avoided, and light blocking effect can be obtained.

Figure 35:
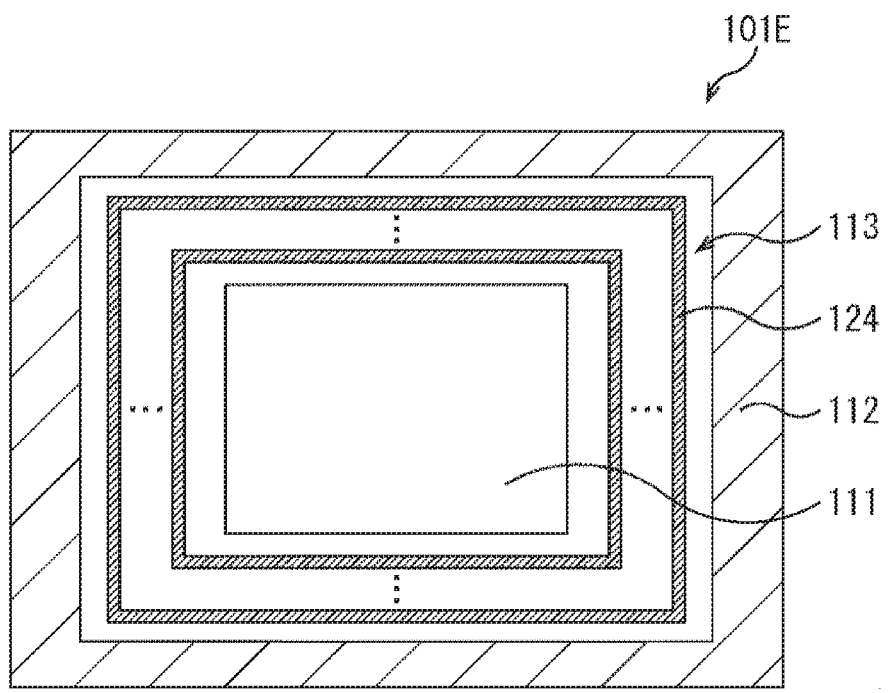
FIG. 35 is a diagram showing a second planar placement example of the structure object in the third embodiment of the solid state imaging element.

In FIG. 35, a second planar placement example of the structure object 124 in the solid state imaging element 101 is shown.

As shown in FIG. 35, in a solid state imaging element 101E, a plurality of structure objects 124 are arranged so as not to be divided but to continuously surround the periphery of the pixel region 111, in the structure object formation region 113 between the pixel region 111 and the peripheral circuit 112. By employing the structure in which structure objects 124 are thus arranged, higher light blocking properties can be obtained.

Figure 36:
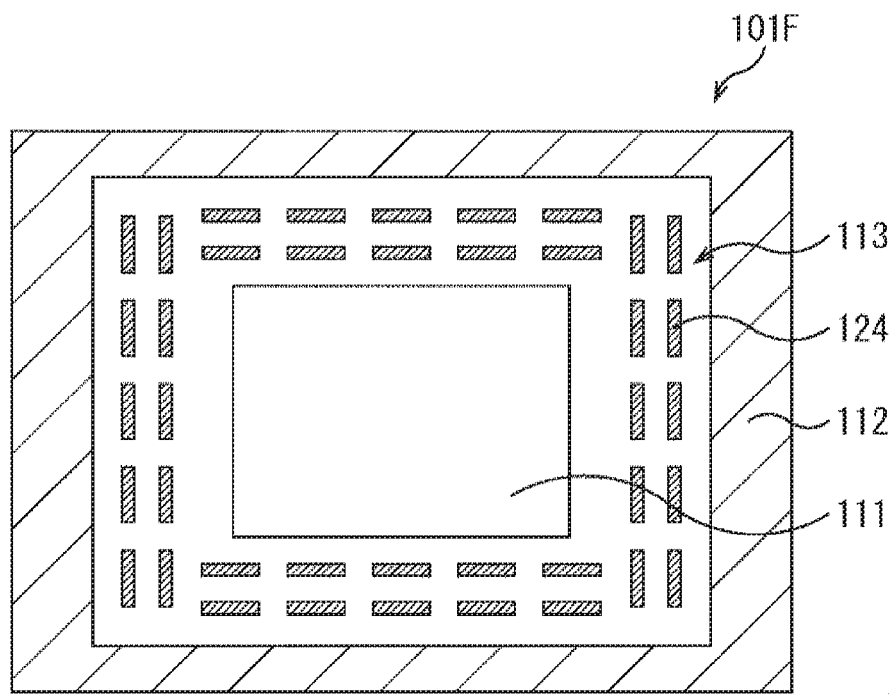
FIG. 36 is a diagram showing a third planar placement example of the structure object in the third embodiment of the solid state imaging element.

In FIG. 36, a third planar placement example of the structure object 124 in the solid state imaging element 101 is shown.

As shown in FIG. 36, in a solid state imaging element 101F, a structure object 124 divided into a plurality of pieces is arranged doubly in the structure object formation region 113 so as to pass between the pixel region 111 and the peripheral circuit 112 and surround the pixel region 111 in a planar view, like in the solid state imaging element 101D of FIG. 34. However, in the solid state imaging element 101F, the periods of adjacent structure objects 124 coincide, unlike in the solid state imaging element 101D of FIG. 34.

Figure 37:
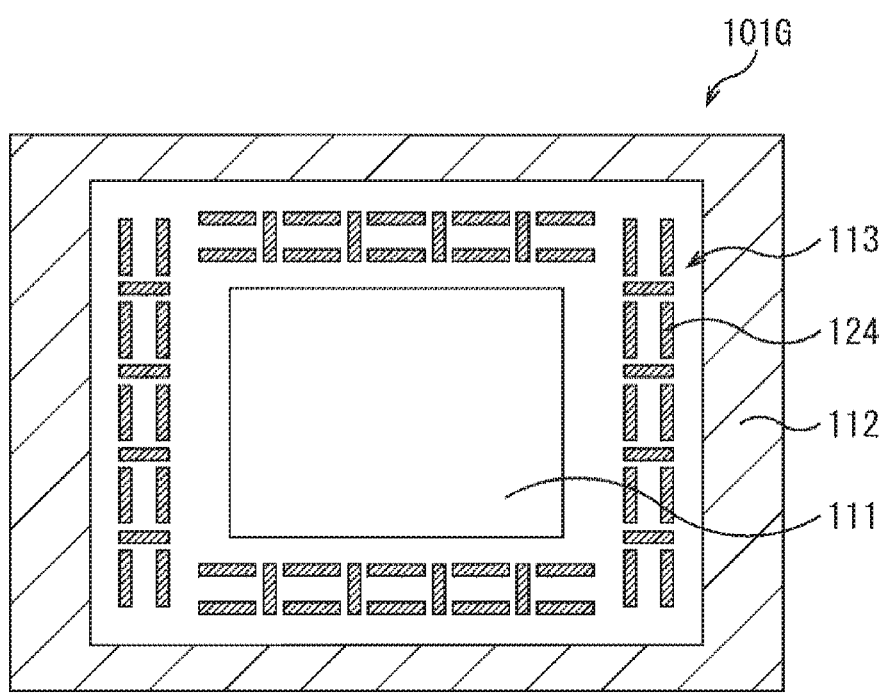
FIG. 37 is a diagram showing a fourth planar placement example of the structure object in the third embodiment of the solid state imaging element.

In FIG. 37, a fourth planar placement example of the structure object 124 in the solid state imaging element 101 is shown.

As shown in FIG. 37, in a solid state imaging element 101G, a structure object 124 divided into a plurality of pieces is arranged doubly in the structure object formation region 113 like in the solid state imaging element 101F of FIG. 36, and further structure objects 124 elongated in a direction orthogonal to the round direction are arranged between adjacent ones of the structure objects 124 divided.

The planar placement of the structure object 124 is not limited to the placement examples of FIGS. 34 to 37, and various placements may be employed.

The present technology can be applied not only to complementary metal oxide semiconductor (CMOS) image sensors but also to charge coupled devices (CCDs). Furthermore, the present technology may be applied to a solid state imaging element 101 of a curved shape. As the cross-sectional shape of the structure object 124, for example, a trapezoidal shape, a triangular shape, etc. may be employed as well as a rectangular shape. Furthermore, the solid state imaging element 101 is not limited to the various dimensions and structures described above.

The solid state imaging elements 11 and 101 of the embodiments like those described above can be used for various electronic apparatuses, such as imaging systems such as digital still cameras and digital video cameras, mobile phones having an imaging function, or other devices having an imaging function, for example.

Figure 38:
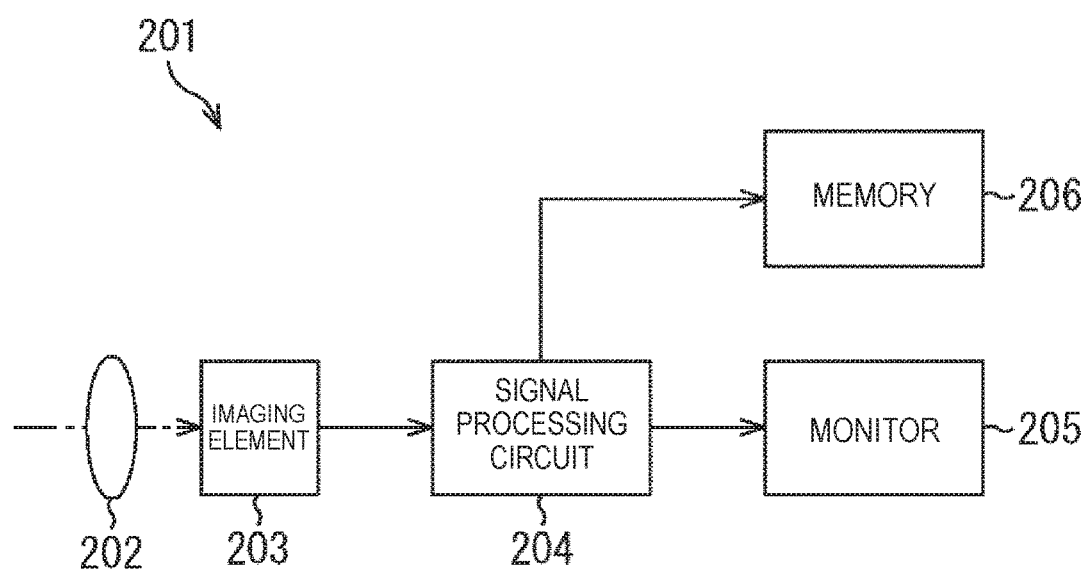
FIG. 38 is a block diagram showing a configuration example of an imaging device installed in an electronic apparatus.

FIG. 38 is a block diagram showing a configuration example of an imaging device installed in an electronic apparatus.

As shown in FIG. 38, an imaging device 201 is configured to include an optical system 202, an imaging element 203, a signal processing circuit 204, a monitor 205, and a memory 206, and can capture still images and moving images.

The optical system 202 is configured to include one or a plurality of lenses, and guides the image light from a subject (incident light) to the imaging element 203 and causes an image to be formed on the light receiving surface (sensor unit) of the imaging element 203.

As the imaging element 203, the solid state imaging element 11 or the solid state imaging element 101 of each embodiment or modification example described above is used. Electrons are stored in the imaging element 203 for a certain period in accordance with the image formed on the light receiving surface via the optical system 202. A signal corresponding to the electrons stored in the imaging element 203 is supplied to the signal processing circuit 204.

The signal processing circuit 204 performs various signal processings on the pixel signal outputted from the imaging element 203. The image (image data) obtained by the signal processing performed by the signal processing circuit 204 is supplied to and displayed on the monitor 205, or is supplied to and stored (recorded) in the memory 206.

In the imaging device 201 thus configured, for example, a high-quality image with less noise can be obtained by using the solid state imaging element 11 or the solid state imaging element 101 of each embodiment or modification example described above.

Additionally, the present technology may also be configured as below.

(1)

A semiconductor device including:

an element formation unit in which a plurality of elements are formed; and an interconnection unit that is stacked on the element formation unit and in which interconnections connecting the elements are formed, wherein a passive element configured to be affected by light, an active element that forms a peripheral circuit placed around the passive element, and a structure object formed between the passive element and the active element in such a manner that a gap in a thickness direction of the element formation unit is not more than a prescribed spacing and formed of a material that inhibits propagation of light are placed in the element formation unit.

(2)

The semiconductor device according to (1), wherein the passive element is a light receiving element configured to receive light and perform photoelectric conversion.

(3)

The semiconductor device according to (2), wherein light that the light receiving element receives is applied to a back surface that is on an opposite side to a front surface at which the interconnection unit is stacked on the element formation unit, and a support substrate configured to support a substrate in which the element formation unit and the interconnection unit are stacked is joined to a front surface side of the substrate.

(4)

The semiconductor device according to any of (1) to (3), wherein the structure object is formed from a front surface at which the interconnection unit is stacked on the element formation unit and is formed in such a manner that a gap between a tip of the structure object and a back surface that is on an opposite side to the front surface is not more than a prescribed spacing.

(5)

The semiconductor device according to any of (1) to (3), wherein the structure object is formed from a back surface that is on an opposite side to a front surface at which the interconnection unit is stacked on the element formation unit and is formed in such a manner that a gap between a tip of the structure object and the front surface is not more than a prescribed spacing.

(6)

The semiconductor device according to any of (1) to (3), wherein the structure object is formed in such a manner that a gap between a tip of a first structure object formed from a front surface at which the interconnection unit is stacked on the element formation unit and a tip of a second structure object formed from a back surface that is on an opposite side to the front surface is not more than a prescribed spacing.

(7)

The semiconductor device according to any of (1) to (6), wherein the structure object is formed in a plurality of places in a space from the active element to the passive element.

(8)

The semiconductor device according to any of (1) to (3), wherein the structure object is arranged in such a manner that a first structure object formed from a front surface that is on a side where the active element is formed in the element formation unit and a second structure object formed from a back surface that is on an opposite side to the front surface overlap when the passive element is viewed from the active element.

(9)

The semiconductor device according to any of (1) to (3), wherein the structure object is formed so as to penetrate through the element formation unit without a gap in a thickness direction of the element formation unit.

(10)

The semiconductor device according to any of (1) to (9), wherein the structure object is formed of a material that refracts or absorbs light.

(11)

The semiconductor device according to (10), wherein the structure object is formed in such a manner that a side wall toward a thickness direction of the element formation unit is inclined with respect to the thickness direction.

(12)

The semiconductor device according to any of (1) to (9), wherein the structure object is formed of a metal that reflects light.

(13)

The semiconductor device according to (12), further including an insulator surrounding a periphery of the structure object.

(14)

The semiconductor device according to (12) or (13), further including an electrode for extracting an electric potential of the structure object.

(15)

The semiconductor device according to any of (1) to (14), wherein the passive element is an analog element with high sensitivity to light noise.

(16)

The semiconductor device according to any of (1) to (15), wherein the structure object is placed so as to pass between a region where the passive element is formed and a region where the active element is formed and surround the region where the passive element is formed in a planar view.

(17)

The semiconductor device according to any of (1) to (15), wherein the structure object is placed so as to pass between a region where the passive element is formed and a region where the active element is formed and surround the region where the active element is formed in a planar view.

(18)

The semiconductor device according to any of (1) to (15), wherein the structure object is placed so as to exist at least on a straight line connecting the passive element and the active element between a region where the passive element is formed and a region where the active element is formed.

(19)

The semiconductor device according to (1), wherein a structure object formation region where one or a plurality of the structure objects are formed is provided between an element region where a plurality of the passive elements are arranged and the peripheral circuit placed around the element region and formed of the active element.

(20)

The semiconductor device according to (19), wherein the structure object is formed of a material that reflects or absorbs infrared light in a silicon layer that forms the element formation unit.

(21)

The semiconductor device according to (19) or (20), wherein a substrate that forms the element formation unit is formed by silicon layers between which a layer formed of a material with a refractive index different from a refractive index of the silicon is formed.

(22)

The semiconductor device according to (21), wherein the structure object is formed of a material that reflects or absorbs infrared light in the silicon layer that forms the element formation unit.

(23)

The semiconductor device according to any of (19) to (22), wherein the structure object is arranged at least doubly so as to surround the element region in a planar view and is divided into a plurality of pieces in a round direction, and adjacent ones of the structure objects are arranged with a shift of a half period.

(24)

The semiconductor device according to any of (19) to (22), wherein the plurality of structure objects are arranged so as to continuously surround a periphery of the element region in a planar view:

(25)

A solid state imaging element including:

an element formation unit in which a plurality of elements are formed, and an interconnection unit that is stacked on the element formation unit and in which interconnections connecting the elements are formed, wherein a light receiving element configured to receive light and perform photoelectric conversion, an active element that forms a peripheral circuit placed around the light receiving element, and a structure object formed between the light receiving element and the active element in such a manner that a gap in a thickness direction of the element formation unit is not more than a prescribed spacing and formed of a material that inhibits propagation of light are placed in the element formation unit, light that the light receiving element receives is applied to a back surface that is on an opposite side to a front surface at which the interconnection unit is stacked on the element formation unit, and a support substrate configured to support a substrate in which the element formation unit and the interconnection unit are stacked is joined to a front surface side of the substrate.

(26)

An electronic apparatus including a solid state imaging element, the solid state imaging element including an element formation unit in which a plurality of elements are formed, and an interconnection unit that is stacked on the element formation unit and in which interconnections connecting the elements are formed, wherein a light receiving element configured to receive light and perform photoelectric conversion, an active element that forms a peripheral circuit placed around the light receiving element, and a structure object formed between the light receiving element and the active element in such a manner that a gap in a thickness direction of the element formation unit is not more than a prescribed spacing and formed of a material that inhibits propagation of light are placed in the element formation unit, light that the light receiving element receives is applied to a back surface that is on an opposite side to a front surface at which the interconnection unit is stacked on the element formation unit, and a support substrate configured to support a substrate in which the element formation unit and the interconnection unit are stacked is joined to a front surface side of the substrate.

The embodiment is not limited to the embodiments described above, and various alterations are possible without departing from the spirit of the present disclosure.

REFERENCE SIGNS LIST 11 solid state imaging element
11J semiconductor device
12 pixel region
12J high-sensitivity analog element region
13 vertical drive circuit
14 column signal processing circuit
15 horizontal drive circuit
16 output circuit
17 control circuit
18 pixel
19 peripheral circuit
21 first substrate
22 second substrate
23 joining layer
24 element formation unit
25 interconnection unit
26 light condensing unit
27 interconnection
31 light receiving element
32 color filter
33 on-chip lens
34 active element
35 structure object
36 insulator
51 gate electrode 52 drain region
53 source region
54 and 55 element isolation unit
101 solid state imaging element
102 silicon substrate
103 silicon oxide film
111 pixel region
112 peripheral circuit
113 structure object formation region
121 light receiving element
122 on-chip lens
123 active element
124 structure object

What is claimed is:

1. A semiconductor device comprising:
an element formation unit in which a plurality of elements are formed; and
an interconnection unit that is stacked on the element formation unit and in which interconnections connecting the elements are formed,
wherein the element formation unit comprises:
a pixel region including an array of a plurality of light receiving elements configured to receive light through a first surface of the element formation unit and perform photoelectric conversion, wherein the array of the plurality of light receiving elements are disposed in a second surface of the element formation unit, the second surface being opposite to the first surface;
a peripheral region outside of and surrounding the array of the plurality of light receiving elements in the pixel region, the peripheral region including an active element that forms part of a peripheral circuit that drives circuitry in the pixel region, wherein the active element includes at least one transistor having a gate electrode disposed in the interconnection unit and a source/drain disposed in the second surface of the element formation unit; and
a structure object disposed between the peripheral region and the pixel region so as to surround the pixel region in a plan view, wherein the structure object is disposed in the second surface of the element formation unit in such a manner that a gap between a tip of the structure object and the first surface of the element formation unit in a thickness direction of the element formation unit is greater than zero and is not more than a prescribed spacing equal to no more than a short wavelength and formed of a material that inhibits propagation of light, wherein the element formation unit comprises a silicon substrate, and wherein the gap between the tip of the structure object and the first surface of the element formation unit includes a portion of the silicon substrate;
a first isolation structure disposed in the second surface, adjacent to the drain, and including a third surface that is coplanar with the second surface; and
a second isolation structure disposed in the second surface, adjacent to the source, and including a fourth surface that is coplanar with the second surface, wherein the first and second isolation structures are positioned so that the active element is electrically isolated from other active elements, and wherein the first and second isolation structures are formed to a depth in the element formation unit that is less than a depth of the structure object.

2. The semiconductor device according to claim 1, further comprising a second structure object formed between the pixel region and the structure object, wherein there is no pixel region between the structure object and the second structure object.

3. the semiconductor device according to claim 1, further comprising:
a support substrate joined to the interconnection unit and configured to support-the element formation unit and the interconnection unit, wherein the structure object is a unitary structure that extends from the second surface toward the first surface and is formed of a material having a different permittivity than the silicon substrate, wherein the first isolation structure touches the drain, wherein the interconnection unit is stacked on the second surface of the element formation unit such that, in the plan view, the interconnections overlap with the pixel region, the active element, and the structure object, wherein the interconnections are electrically connected to the peripheral circuit and carry signals that drive the peripheral circuit, and wherein the second isolation structure is spaced apart from the source.

4. The semiconductor device according to claim 3, further comprising:
a lens layer including curved portions disposed over the pixel region and a flat portion disposed over the peripheral region, wherein the structure object overlaps the flat portion in the plan view, and wherein the gap is less than 400 nm.

5. The semiconductor device according to claim 1, wherein the structure object is formed of a material that refracts or absorbs hot carrier luminescence from the active element.

6. The semiconductor device according to claim 5, wherein the structure object is formed in such a manner that a side wall toward a thickness direction of the element formation unit is inclined with respect to the thickness direction.

7. The semiconductor device according to claim 1, wherein the structure object is formed in a plurality of places.

8. The semiconductor device according to claim 1, wherein the structure object includes a first structure object and a second structure object, wherein the first structure object formed from a front surface that is on a side where the active element is formed in the element formation unit and the second structure object formed from a back surface that is on an opposite side to the front surface overlap when the pixel region is viewed from the active element.

9. The semiconductor device according to claim 1, wherein the structure object is formed of a metal that reflects light.

10. The semiconductor device according to claim 9, further comprising an insulator surrounding a periphery of the structure object.

11. The semiconductor device according to claim 9, further comprising an electrode for extracting an electric potential of the structure object.

12. The semiconductor device according to claim 1, wherein the pixel region includes an analog element with high sensitivity to light noise.

13. The semiconductor device according to claim 1, wherein the structure object is formed of a material that reflects or absorbs infrared light in the silicon substrate.

14. A solid state imaging element comprising:
an element formation unit in which a plurality of elements are formed; and an interconnection unit that is stacked on the element formation unit and in which interconnections connecting the elements are formed, wherein the element formation unit comprises:

a pixel region including an array of light receiving elements configured to receive light through a first surface of the element formation unit and perform photoelectric conversion, wherein the array of the receiving elements are disposed in a second surface of the element formation unit, the second surface being opposite to the first surface;

a peripheral region outside of and surrounding the array of the light receiving elements in the pixel region, the peripheral region including an active element that forms part of a peripheral circuit that drives circuitry in the pixel region, wherein the active element includes at least one transistor having a gate electrode disposed in the interconnection unit and a source/drain disposed in the second surface of the element formation unit; and a structure object disposed between the peripheral region and the pixel region so as to surround the pixel region in a plan view, wherein the structure object is disposed in the second surface of the element formation unit in such a manner that a gap between a tip of the structure object and the first surface of the element formation unit in a thickness direction of the element formation unit is greater than zero and is not more than a prescribed spacing equal to no more than a short wavelength and formed of a material that inhibits propagation of light;

a first isolation structure disposed in the second surface, adjacent to the drain, and including a third surface that is coplanar with the second surface; and a second isolation structure disposed in the second surface, adjacent to the source, and including a fourth surface that is coplanar with the second surface, wherein the first and second isolation structures are positioned so that the active element is electrically isolated from other active elements, and wherein the first and second isolation structures are formed to a depth in the element formation unit that is less than a depth of the structure object; and a support substrate joined to the interconnection unit and configured to support the element formation unit and the interconnection unit, wherein the element formation unit comprises a silicon substrate, and wherein the gap between the tip of the structure object and the first surface of the element formation unit includes a portion of the silicon substrate.

15. An electronic apparatus comprising a solid state imaging element, the solid state imaging element including:

an element formation unit in which a plurality of elements are formed, and an interconnection unit that is stacked on the element formation unit and in which interconnections connecting the elements are formed, wherein the element formation unit comprises:

a pixel region including an array of light receiving elements configured to receive light through a first surface of the element formation unit and perform photoelectric conversion, wherein the array of the receiving elements are disposed in a second surface of the element formation unit, the second surface being opposite to the first surface;

a peripheral region outside of and surrounding the array of the light receiving elements in the pixel region, the peripheral region including an active element that forms part of a peripheral circuit that drives circuitry in the pixel region, wherein the active element includes at least one transistor having a gate electrode disposed in the interconnection unit and a source/drain disposed in the second surface of the element formation unit; and a structure object disposed between the peripheral region and the pixel region so as to surround the pixel region in a plan view, wherein the structure object is disposed in the second surface of the element formation unit in such a manner that a gap between a tip of the structure object and the first surface of the element formation unit in a thickness direction of the element formation unit is greater than zero and is not more than a prescribed spacing equal to no more than a short wavelength and formed of a material that inhibits propagation of light;

a first isolation structure disposed in the second surface, adjacent to the drain, and including a third surface that is coplanar with the second surface; and a second isolation structure disposed in the second surface, adjacent to the source, and including a fourth surface that is coplanar with the second surface, wherein the first and second isolation structures are positioned so that the active element is electrically isolated from other active elements, and wherein the first and second isolation structures are formed to a depth in the element formation unit that is less than a depth of the structure object; and a support substrate joined to the interconnection unit and configured to support the element formation unit and the interconnection unit, wherein the element formation unit comprises a silicon substrate, and wherein the gap between the tip of the structure object and the first surface of the element formation unit includes a portion of the silicon substrate.

* * * * *